(12) United States Patent
Myers et al.

(10) Patent No.: US 7,557,562 B2
(45) Date of Patent: Jul. 7, 2009

(54) INVERTED MAGNETIC ISOLATOR

(75) Inventors: John K. Myers, Edina, MN (US); James M. Daughton, Eden Prairie, MN (US)

(73) Assignee: NVE Corporation, Eden Prairie, MN (US)

( * ) Notice: Subject to any disclaimer, the term of this patent is extended or adjusted under 35 U.S.C. 154(b) by 0 days.

(21) Appl. No.: 11/229,282

(22) Filed: Sep. 16, 2005

(65) Prior Publication Data

US 2006/0061350 A1     Mar. 23, 2006

Related U.S. Application Data

(60) Provisional application No. 60/610,700, filed on Sep. 17, 2004.

(51) Int. Cl.
| | | |
|---|---|---|
| *G01R 15/18* | (2006.01) | |
| *G01R 19/20* | (2006.01) | |
| *G01R 15/20* | (2006.01) | |
| *G11B 5/33* | (2006.01) | |
| *G11B 5/127* | (2006.01) | |

(52) U.S. Cl. .................................. 324/117 R; 360/313
(58) Field of Classification Search .................. 324/96, 324/126, 127, 117 H, 117 R
See application file for complete search history.

(56) References Cited

U.S. PATENT DOCUMENTS

| | | |
|---|---|---|
| 4,075,671 A | 2/1978 | Cheatham et al. |
| 4,097,802 A | 6/1978 | Mazzeo et al. |
| 4,414,510 A | 11/1983 | Milkovic |
| 4,464,629 A | 8/1984 | Tanaka et al. |
| 4,520,311 A | 5/1985 | Petr et al. |
| 4,596,950 A | 6/1986 | Lienhard et al. |
| 4,603,365 A | 7/1986 | Nakamura |
| 4,754,219 A | 6/1988 | Milkovik |
| 5,005,064 A | 4/1991 | Yoshino et al. |
| 5,119,025 A | 6/1992 | Smith et al. |
| 5,122,227 A | 6/1992 | Ott |
| 5,206,590 A | 4/1993 | Dieny et al. |
| 5,247,278 A | 9/1993 | Pant et al. |
| 5,260,653 A | 11/1993 | Smith et al. |
| 5,302,461 A | 4/1994 | Anthony |
| 5,313,186 A | 5/1994 | Schuhl et al. |

(Continued)

FOREIGN PATENT DOCUMENTS

EP     0 594 243 A     4/1994

(Continued)

*Primary Examiner*—Ha Tran T Nguyen
*Assistant Examiner*—Roberto Velez
(74) *Attorney, Agent, or Firm*—Kinney & Lange, P.A.

(57) ABSTRACT

A current determiner comprising a first input conductor and a first current sensor, formed of a plurality of magnetoresistive, anisotropic, ferromagnetic thin-film layers at least two of which are separated from one another by a nonmagnetic layer positioned therebetween, and both supported on a substrate adjacent to and spaced apart from one another so they are electrically isolated with the first current sensor positioned in those magnetic fields arising from any input currents. A first shield/concentrator of a material exhibiting a substantial magnetic permeability is positioned between the substrate and the first input conductor. A similar second current sensor can be individually formed, but can also be in the current determiner structure that is supported on the substrate along with a second input conductor supported on the substrate suited for conducting input currents therethrough.

21 Claims, 12 Drawing Sheets

U.S. PATENT DOCUMENTS

| | | |
|---|---|---|
| 5,329,413 A | 7/1994 | Kondoh et al. |
| 5,399,965 A | 3/1995 | Heberle |
| 5,512,818 A | 4/1996 | Jin et al. |
| 5,561,366 A | 10/1996 | Takahashi et al. |
| 5,561,368 A | 10/1996 | Dovek et al. |
| 5,585,719 A | 12/1996 | Endo et al. |
| 5,589,709 A | 12/1996 | Dobkin et al. |
| 5,617,071 A | 4/1997 | Daughton |
| 5,636,159 A | 6/1997 | Pohm |
| 5,831,426 A | 11/1998 | Black, Jr. et al. |
| 5,951,459 A | 9/1999 | Blackwell |
| 5,982,176 A | 11/1999 | Kawamura et al. |
| 6,165,803 A * | 12/2000 | Chen et al. ..................... 438/3 |
| 6,188,549 B1 * | 2/2001 | Wiitala ....................... 360/320 |
| 6,300,617 B1 * | 10/2001 | Daughton et al. ........ 250/214.1 |
| 7,053,429 B2 * | 5/2006 | Katti ........................... 257/295 |
| 2003/0117836 A1 * | 6/2003 | Kim et al. ................... 365/158 |

FOREIGN PATENT DOCUMENTS

| | | |
|---|---|---|
| JP | 10 026639 | 1/1998 |
| WO | WO 98 07165 | 2/1998 |
| WO | WO 98 37672 | 8/1998 |

* cited by examiner

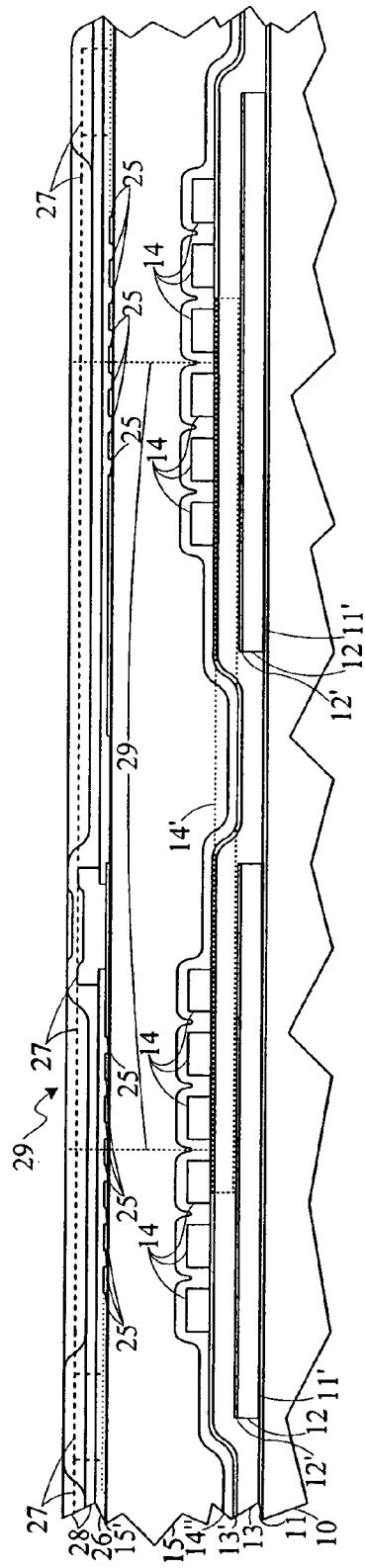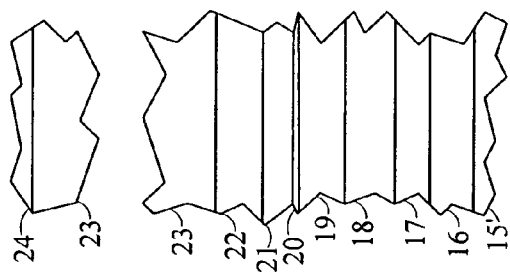
Fig. 2A
Fig. 2B

INVERTED MAGNETIC ISOLATOR

CROSS-REFERENCE TO RELATED APPLICATION

This application claims the benefit of Provisional Application No. 60/610,700 filed on Sep. 17, 2004 for "INVERTED MAGNETIC ISOLATOR".

BACKGROUND OF THE INVENTION

The present invention relates to ferromagnetic thin-film structures exhibiting relatively large magnetoresistive characteristics and, more particularly, to such structures used to magnetically couple signals from a source to an isolated receiver.

Many kinds of electronic systems make use of magnetic devices including both digital systems, such as memories, and analog systems such as field sensors. Magnetometers and other magnetic sensing devices are used extensively in many kinds of systems including magnetic disk memories and magnetic tape storage systems of various kinds. Such devices provide output signals representing the magnetic field sensed thereby in a variety of situations.

One use for such magnetic field sensors is the sensing of magnetic fields generated by electrical currents in a conductor as a basis for inferring the nature of such current giving rise to these fields. While this has long been done for magnetic fields generated by substantial currents, such sensing becomes more difficult to accomplish in smaller ranges of currents that include relatively quite small currents. The need for sensing fields due to such small currents arises, for instance, in situations where the currents generating the fields to be measured are provided merely as a basis for conveying signal information rather than for transmitting substantial electrical energy.

Such a situation occurs in many medical systems, instrumentation systems and control systems where there is often a need to communicate signals to system portions over signal interconnections from an external source or from another portion of the system. Often, the conductors carrying signal currents for such purposes must be electrically isolated from the portion of the system containing the sensor arrangement for those signals to measure the resulting magnetic fields. As an example, a long current loop carrying signal information in the loop current may, because of resistances occurring in ground path interconnections usually considered as resistance free, become subject to having large voltage potentials relative to some ground point developed thereon. Such potentials must in many instances be kept from the signal sensing and receiving circuitry to avoid damage thereto even though that circuitry must still be able to capture the signal information contained in the loop current.

Signal isolators for these purposes are often preferably formed in monolithic integrated circuit chips for reasons of cost, convenience and system performance. In such an arrangement, one or more solid state magnetic field sensors are used to detect the magnetic fields provided by the currents containing the signals. A kind of magnetic field sensor which has been used in this situation is a Hall effect device. Such devices are often not satisfactory for sensing the magnetic fields due to small currents because of the limited sensitivity they exhibit with respect to magnetic fields.

Furthermore, there is often a lack of satisfactory remedial or supplementary measures in such arrangements for improving the limited sensitivity of Hall effect devices. The use of field concentrators is difficult to provide in a monolithic integrated circuit containing a Hall device because of the magnetically sensitive axis of that device being perpendicular to the directions the Hall device in the monolithic integrated circuit extends over the substrate supporting that device, i.e. the device axis of sensitivity is parallel to the thickness of the device rather than to the width or length thereof. Also information provided by Hall devices as to the magnetic fields measured thereby is in the form of a voltage which limits the use of such devices in bridge circuits which might otherwise be used for purposes of increasing the output signal providing the current signal information.

Another possibility in either hybrid integrated circuits or monolithic integrated circuits for signal isolation is the use of a light source having its electromagnetic radiation intensities controlled by signal currents from a signal source. Such a light source is electrically isolated from a light detector provided in the integrated circuit that is used to infer the nature of the signal currents from the light transmitted to and received thereby. Difficult engineering and economic problems make this an unsatisfactory solution as are various alternative capacitance based coupling solutions because of the same kinds of problems.

A further possibility has emerged in these circumstances for signal isolation in both hybrid integrated circuits and monolithic integrated circuits involving a current determiner comprising an input conductor, typically in some coiled configuration, and a current sensor both supported on a substrate adjacent to and spaced apart from one another so they are electrically isolated but with the current sensor positioned in those magnetic fields arising from any input currents in the input conductor. Such an isolated signals current determiner is an attractive device for these purposes in being both rapid in operation and economical in cost.

In the recent past, providing such current sensors as magnetoresistive effect based sensors in the form of an intermediate thin layer of an electrically conductive, nonmagnetic separating material having two major surfaces on each of which an anisotropic ferromagnetic thin-film is positioned has been found to lead to a "giant magnetoresistive effect" in the sensor if the thicknesses of the ferromagnetic thin-films and the intermediate layers in such a "sandwich" structure have been made sufficiently small. This effect can be enhanced by forming such sensors with additional alternating ones of these ferromagnetic films and intermediate layers to form superlattices. The resulting enhanced "giant magnetoresistive effect" can yield a magnetoresistive response which can be in the range of up to an order of magnitude greater than that due to the well known anisotropic magnetoresistive response.

Such an isolated signal current determiner can be used to couple input signals provided in an input conductor to a receiver isolated from the input conductor, the input signals then being substantially replicated in a receiver circuit to provide similar representations of those input signals at the receiver output. This is often a satisfactory arrangement for coupling digital data input signals into a system isolated from the source of the input signals, and a high withstanding voltage can be provided between the system input and output to achieve very substantial signal isolation between them.

However, the input conductor is usually provided in the form of a planar coil separated by electrical insulating material from the current determiner below formed on a monolithic integrated circuit, serving as a substrate while also providing the operating circuitry for the system, and eases the fabrication of the relatively thick, magnetically permeable material layers serving as shields and field concentrators that must be provided on a side of the coil opposite that side thereof at which the current determiner is located. Thus, the coil must then be fabricated after the insulating material is deposited and an input signal source must thereafter be connected to the planar coil requiring substantial bonding pads at the ends of the coil for such interconnections. Furthermore, the signal progresses in only one direction in such a system thereby requiring two such systems for interactive communication between the initial signal source and the initial receiver. Thus, there is a need for a signal isolation device exhibiting relatively high sensitivity, relatively high power efficiency, relatively high withstanding voltage and an interactive capability, but which can be fabricated at a reasonably economic cost with good reliability.

BRIEF SUMMARY OF THE INVENTION

The present invention provides a current determiner having an output at which representations of input currents are provided for input currents that are supplied from a source, the current determiner comprising a first input conductor and a first current sensor both supported on a substrate adjacent to and spaced apart from one another so they are electrically isolated with the first current sensor positioned in those magnetic fields arising from any input currents. A first shield/concentrator of a material exhibiting a substantial magnetic permeability is positioned between the substrate and the first input conductor. The first current sensor is formed of a plurality of magnetoresistive, anisotropic, ferromagnetic thin-film layers at least two of which are separated from one another by a nonmagnetic layer positioned therebetween. The first shield/concentrator layer can supported on the substrate between the first input conductor and that substrate, formed as a supporting structure in a current determiner housing, or a shield structure attached to such a supporting structure. The substrate can include a monolithic integrated circuit structure containing electronic circuit components of which at least one is electrically connected to the first input conductor.

A second current sensor can be individually formed, but can also be in the current determiner structure that is supported on the substrate that is also formed of a plurality of magnetoresistive, anisotropic, ferromagnetic thin-film layers at least two of which are separated from one another by a nonmagnetic layer positioned therebetween along with a second input conductor supported on the substrate suited for conducting input currents therethrough. This second input conductor is positioned at that side of the second current sensor opposite to that side thereof facing the substrate so as to be adjacent to, yet spaced apart from, the second current sensor to thereby be electrically isolated from any direct circuit interconnection therewith on the substrate but to have the second current sensor positioned in those magnetic fields arising from the input currents in the second input conductor. In addition, a second shield/concentrator layer of material exhibiting a substantial magnetic permeability to serve as a magnetic field concentrator is positioned at that side of the second input conductor opposite to that side thereof facing the substrate. In the first instance, the second shield/concentrator layer is electrically connected to the second input conductor, and can be so connected in the second instance.

BRIEF DESCRIPTION OF THE DRAWINGS

FIGS. 2A and 2B are layer diagrams of parts of the structure portion shown in FIG. 1.

DETAILED DESCRIPTION

Figure 1:
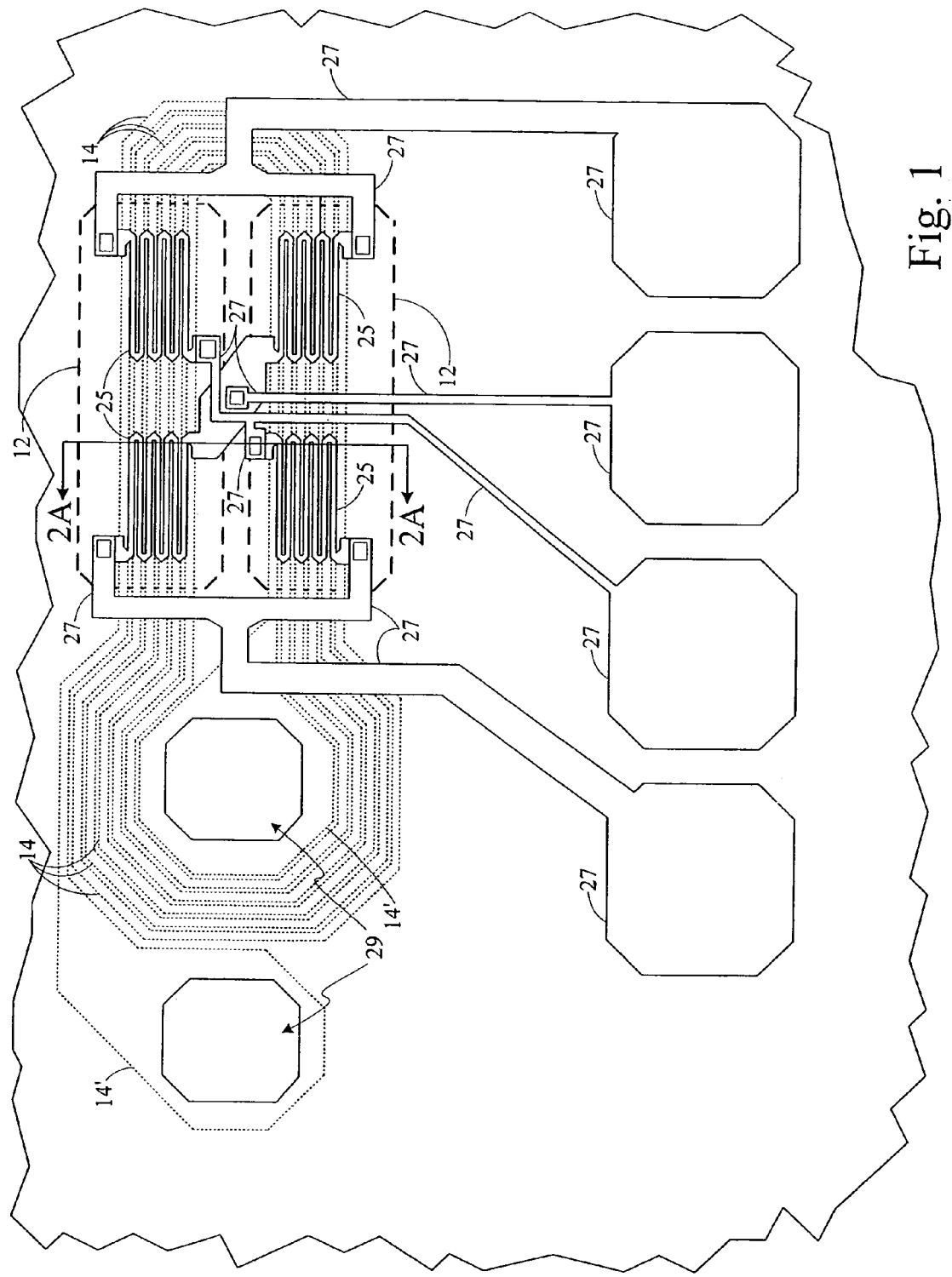
FIG. 1 is a plan view of a portion of a monolithic integrated circuit structure embodying the present invention.

A basic "sandwich" structure magnetic field sensor has a sensor electrical resistance versus applied external field characteristic for an external magnetic field applied in one direction perpendicular to its easy axis that generally appears in its graph on a resistance versus field Cartesian coordinates graph as a horizontal line at the sensor minimum resistance value except for an excursion therein to greater resistance values located at or near to the zero applied magnetic field value. This excursion typically appears as a more or less "baseless" isosceles triangular shape with an increase from the minimum sensor resistance value to a peak sensor resistance value at zero field followed by a decrease to the minimum sensor resistance value, or it may appear to be a triangular shaped excursion to higher resistance values except for a flat, or "plateau", portion at the top thereof at the maximum sensor resistance value. Thus, plotting the characteristics resulting from applying external magnetic fields in both directions perpendicular to the sensor easy axis on the same graph results in a pair of overlapping triangular excursion graphs approximately centered about the zero external applied field value as the basic "sandwich" structure current sensor resistance versus external field characteristic.

Such a characteristic has no sharp switching thresholds therein thus requiring any such thresholds to be provided in the subsequent electronic circuitry. In smaller sized sensors where the demagnetization fields in the sensor magnetic layers become relatively more significant, the triangular shape shifts so as to provide a side more closely paralleling the resistance axis of the graph to thereby result in providing magnetic switching thresholds in the current sensor itself. Also, the double triangle characteristic described above for the basic "sandwich" structure field sensor is symmetrical on both sides of the zero value of externally applied fields.

Thus, some sort of a bias such as a bias magnetic field must be supplied to such field sensors connected in sensor bridge circuits to force one pair of those sensors to operate on one side of their triangular characteristics and the other pair to operate on the other triangular side of their triangular characteristics if directions of applied external magnetic fields are to be distinguishable. This asymmetry introduced by the bias field makes possible the two pairs of those sensors in such circuits changing their electrical resistances in opposite directions in the presence of an external applied field so as to make available a bridge circuit output signal. Such a bias field requirement also limits the magnitudes of external applied fields to be sensed to being less than the bias field magnitude for proper operation. Alternatively, a current bias could be introduced in the input conductor in which signal currents generate magnetic fields to be sensed by some current sensors in a bridge circuit to set a reference point about which input current changes will result in corresponding output signal changes. A further alternative is to just provide a field absolute value sensor.

A "pinned" layer "sandwich" structure is provided by a "spin valve" structure in which one magnetic layer in a "sandwich" structure has its magnetization firmly maintained in a selected direction despite significant applied external magnetic fields while the other magnetic layer is relatively quite free to have its magnetization rotate in response to such applied external magnetic fields. This structure results in a sensor electrical resistance versus applied external field characteristic for an external magnetic field applied in both directions perpendicular to the sensor easy axis that generally appears shaped like a typical magnetic material hysteresis curve centered about a zero value applied field. This device electrical resistance versus external applied field hysteresis characteristic shown on a resistance versus field Cartesian coordinates graph has two more or less parallel sides approximately centered about the zero external applied field value each with a substantial directional component paralleling the resistance axis. These sides extend between an upper saturation value at the maximum resistance value of the sensor and a lower saturation value at the minimum resistance value of the sensor so that these sides represent magnetic switching thresholds leading to asymmetrical saturation resistance values on the opposite sides of the zero value of externally applied magnetic fields.

Because of this asymmetry in the sensor electrical resistance versus applied external field characteristic, i.e. the upper saturation value at the maximum resistance value of the sensor on one side of zero value of externally applied magnetic fields and the lower saturation value at the minimum resistance value of the sensor on the other, no bias magnetic field or bias current is needed for such sensors in bridge circuits. Changes in input current polarity in the input conductor will lead directly to changes in bridge output signal polarity.

The magnetic layer in the "pinned" layer "sandwich" structure having a relatively freely orientable magnetization is, as indicated, intended to be magnetically more or less independent of the magnetic layer therein having a relatively fixed orientation magnetization. The nonmagnetic conducting layer is chosen to be relatively thick so that there is relatively little exchange coupling between the two magnetic film layers in this structure, and there is also a relatively small magnetostatic coupling therebetween. Although these characteristics can also be true of a basic "sandwich" structure, they do not provide an asymmetry in the electrical resistance versus applied external field characteristic for such structures.

Thus, going to a "spin valve" structure for the current sensor in the signal isolator avoids the need for any biasing arrangement. Furthermore, the resulting bipolar output signal in a bridge can be used to provide a doubling of the output signal magnitude range in response to input digital data pulses.

In addition, the presence of an effective switching value hysteresis as a result of the current sensor resistance versus applied external magnetic field characteristic of the "spin valve" structure serves to effectively filter out electrical noise accompanying the digital data current pulses in the input signal provided to the signal isolator input conductor or conductor coil. This comes about because the switching of the free magnetic layer in the current sensor "spin valve" structure, once it occurs, will not be undone by such noise due to this hysteresis requiring a significantly different input conductor current value to again switch the magnetization direction of that free layer from the value which previously switched that direction. Thus, the output from the current sensor is a "squared up" signal having relatively little variation from the normal logic value magnitudes expected therein as compared to the digital data input signal applied to the input conductor.

Of course, the maximum signal power can be extracted from the digital data input signal supplied to the isolator input conductor or conductor coil by choosing that input conductor to have an effective impedance which matches the characteristic impedance of the input transmission line connected thereto. Thus, the number of turns in the input conductor coil, the length and the resistance of the individual loops in the coil can be adjusted to have its characteristic impedance closely match that of the incoming transmission line, although in some situations these choices must be supplemented by the use therewith of further structures to provide such a match.

The digital data current pulses occurring in the input conductor or conductor coil after transmission thereto over a transmission line must, of course, have sufficient current magnitude to provide the necessary magnetic fields thereabout to reach the saturation magnetization magnitudes of the "spin valve" current sensor. Thus, substantial electrical power can be dissipated in transmitting such input digital data current pulse logic value signals over longer transmission lines. Such power requirements can be significantly further reduced by providing, instead of pulses representing a binary bit by maintaining an essentially constant logic value current magnitude over the entire pulse rate period, just an impulse-like current flow at the beginning of such a pulse rate period in which such a logic value pulse is to occur. That is, a very short initial pulse in a pulse rate period can take the place of a digital data current pulse lasting the entire pulse rate period to thereby significantly reduce the electrical power involved. The minimum duration of the impulse-like current pulse must exceed the rise time of a magnetization orientation change in the "spin valve" current sensor to the switching threshold, as increased by the loading of any parasitic circuit components effective in the transmission of an input conductor pulse, to become a corresponding current sensor output signal pulse.

Also, in many situations, the signal isolator user will desire to provide only typical logic signals that are generated in whatever logic system technology the user is employing at the logic signal generation source to provide the basis for transmitting digital data on the transmission line connected to the input of the signal isolator. That is, for instance, the signal source may be a monolithic integrated circuit fabricated using complementary metal-oxide-semiconductor (CMOS) technology to result in that integrated circuit providing, at its output, digital logic circuitry logic value voltage magnitudes common to that technology. Since such logic signals typically will not have sufficient current or power capability to operate the input conductor or coiled conductor of a signal isolator, a circuit must be provided ahead of that input conductor for converting logic value voltage magnitudes in a particular monolithic integrated circuit technology to current magnitudes sufficient to operate the input conductor.

Thus, an input signal converter will be convenient to provide at the signal isolator input for both of these purposes. Such a converter will be used to convert standard logic value voltage magnitude pulses for some particular signal source technology to impulse-like current pulses at the beginning of pulse rate periods to operate the input conductor or coiled conductor of the signal isolator. This will free a user of the signal isolator from any need to change the usual output digital logic signals from the user's signal source in any way to meet the needs of that isolator, and frees that user from having to supply the power needed by the signal isolator to operate. Again, the input of this converter can be adjusted to have its characteristic impedance closely match that of the incoming transmission line including the use therewith of specific circuit structures to provide such a match.

Sequences of digital data logic value pulses can be converted to corresponding impulse-like current excursions by submitting those sequences of digital data logic value pulses to an analog differentiator so that corresponding impulse-like voltage excursions of opposite polarity occur at the differentiator output for both the leading edge and the trailing edge of each such pulse. However, such differentiation of signals is inherently a noise generation process with that noise typically increasing in magnitude as the pulse rate increases. Thus, substituting instead a very short duration pulse or impulse-like current excursion at the leading and trailing edges of each digital data logic value pulse approximates the differentiating process without generating as much unwanted electrical noise.

Again, the minimum pulse width for these very short current pulses must exceed the rise time of the magnetization orientation of the "spin valve" current sensor to its rotational threshold value as increased by any parasitics involved with this circuit arrangement. Typically, assured switching with such short duration current pulses or excursions requires that the pulse amplitude be well beyond those necessary to provide magnetic fields that just reach the saturation magnetization magnitudes of the "spin valve" current sensor. Nevertheless, because of the shortness of the current excursion duration, there will be a decrease in electrical power dissipated.

After such generation of current excursions in the input conductor or coiled conductor of the signal isolator, recovering the corresponding digital data from the isolator current sensor is determined in part at least by the nature of the electrical resistance versus applied external magnetic field characteristic of that current sensor. As indicated above, this characteristic for a "spin valve" based "sandwich" structure appears as a hysteresis loop approximately centered on a zero applied external field value, and having more or less parallel sides typically representing magnetic saturation or switching thresholds extending between the sensor minimum resistance value and maximum resistance value which sides have a substantial directional component parallel to the resistance axis. The current sensor can be forced to one or the other of these extreme resistance value states by applying external magnetic fields having magnitudes exceeding the magnitudes of the magnetic saturation or switching threshold values.

If the hysteresis characteristic parallel sides have the directional components thereof which are parallel to the resistance axis of the graph also being relatively small, the primary direction of the hysteresis loop between the minimum and maximum resistance values appears canted with respect to the resistance value axis. As a result, the resistance value for the current sensor after the removal of an applied external field will be either significantly less than the maximum resistance value for the current sensor or significantly more than the minimum resistance value for that current sensor depending on applied field direction. With sufficient canting, the sides of the hysteresis loop will approach one another to essentially merge into a straight line so that there will be a common resistance value after the removal of an applied external field in either direction.

In this circumstance, a data latch needs to be used across the current sensor output to provide "memory", i.e. to retain the information as to which of the extreme resistance value states last occurred in the current sensor as a result of the occurrence of a short term current pulse in the input conductor. That is, the occurrence in the current sensor of a maximum resistance state value or a minimum resistance state value, corresponding to the largest output voltage signals from the current sensor in response to a sense current or bridge operating current provided therethrough, will cause the data latch to go into one of its logic states or the other. This logic state in the latch thus represents the information as to which extreme resistance value last occurred in the current sensor, and is information which could otherwise be lost because of the final resistance value of the current sensor, after being in such a state followed by the corresponding magnetic field generated about the input conductor going to zero, being relatively similar subsequent to the sensor having been in either extreme resistance state. This closeness of the final resistance values of the sensor, upon the removal of any significant external magnetic field following such a field having forced the sensor to either extreme resistance value state, occurs because of the canting of the hysteresis loop with respect to the resistance axis of the graph.

On the other hand, a resistance versus applied external field characteristic for a current sensor in the form of a hysteresis loop having sides with directional components parallel to the resistance axis of the graph that are relatively large leaves the loop appearing relatively "square"in that graph. In this situation, the current sensor has final resistance values, upon the removal of any significant external magnetic field following such a field having forced the sensor to either extreme resistance value state, which are close in value to the resistance value of the corresponding last extreme resistance value state which occurred in that sensor. In these circumstances, a data latch is not needed across the current sensor output because the memory of the last extreme resistance value state occurring in the current sensor is effectively stored in that sensor by the final resistance value occurring in the sensor after removal of the applied external magnetic field. A sense current or bridge operating current provided through the sensor will result in corresponding output voltages for each final resistance value sufficiently different from one another to be relatively easily distinguishable by the subsequent circuitry connected to the sensor output.

Thus, there is a desire to obtain a hysteresis loop for a current sensor having a resistance versus applied external field characteristic in the form of a hysteresis loop which has the main extent thereof between the sensor maximum and minimum resistance value states extending substantially parallel to the resistance axis to yield a "squared up" appearance. This requires that the externally applied magnetic field to be sensed in the current sensor be oriented substantially parallel to the easy axes of the magnetic material layers therein. Hence, the input current conductor, or the main extent of a coiled input current conductor, is to be provided substantially perpendicular to the easy axes of the magnetic layers in the current sensor. The resulting current sensor will then "remember" the last extreme resistance value state to which it was forced by external magnetic fields generated by current excursions in the input conductor or coiled input conductor in its final resistance value occurring after the removal of such an externally applied magnetic field.

On the other hand, a current sensor having a resistance versus applied external field characteristic in the form of a canted hysteresis loop also is desirable even though added hysteresis has to be provided in the electronic circuitry connected to the current sensor output. This is because magnetization direction reorientation is primarily accomplished by rotational switching and only relatively limited magnetic field changes are needed to do so. As a result, very rapid magnetization direction reversals occur, the current sensor devices can be compact, and lower power dissipation occurs in the input conductor. Such a loop requires that the externally applied magnetic field to be sensed in the current sensor be oriented substantially perpendicular to the easy axes of the magnetic material layers therein. Thus, the input current conductor, or the main extent of a coiled input current conductor, is to be provided substantially parallel to the easy axes of the magnetic layers in the current sensor.

Signal isolators, based on the magnetoresistive sensing of corresponding magnetic conditions generated therein by input signals delivered to its input, that are formed in accord with the foregoing structural parameters can be advantageously fabricated using ferromagnetic thin-film materials. Such devices may be provided on a surface of a monolithic integrated circuit to thereby allow providing convenient electrical connections between the sensor device and the operating circuitry therefor, although they need not be so provided, as they can be provided in hybrid integrated circuit arrangements too, or in combinations thereof. Those devices provided on a surface of a monolithic integrated circuit in the past have had the current sensors first provided on that surface followed by providing electrical insulating material and then the input conductor usually in the form of a planar coil.

FIG. 1 shows a plan, or top, view of a part of a signal isolator chip in which the order of stacking these device structural components outwardly from the substrate is reversed although, in this example, this isolator is separately formed as a hybrid integrated circuit on an insulating substrate, such as an electrical insulating layer covered silicon or ceramic material substrate, rather than as a portion of a monolithic integrated circuit so that the operating circuitry for the system will be provided externally thereto. Alternatively, as will be shown in a subsequent example, the signal isolator can be formed as part of a monolithic integrated circuit including a supporting semiconductor chip as part of the isolator substrate which can have conveniently provided therein the operating circuitry for that signal isolator. The outer protective or passivation layer that is typically provided over the structure shown in these figures in actual use has been omitted in this view for clarity as have some other layers so that the thereby visible structure portions are shown in solid line form except for those structure portions beneath other structure portions appearing in those figures which are shown in dashed line form. A further exception is that some other structures have been indicated in outline only by further alternative dashed lines forms again for clarity to avoid having these structures cover over other underlying structures.

Corresponding to FIG. 1 are FIGS. 2A and 2B which are layer diagrams of corresponding portions of the structures shown in FIG. 1 as marked in FIG. 1 in the instance of FIG. 2A by a section line. These layer diagrams give an indication of the structural layers leading to the structures shown in FIG. 1 but are not true cross-section views in that many dimensions are exaggerated or reduced for purposes of clarity.

As indicated above, the signal isolator in connection with these figures is provided on a substrate, 10, having a relatively smooth electrical insulating layer, 11, of 2000 Å of silicon nitride ($Si_3N_4$) provided thereover. Then, a 200 Å thick layer of tantalum (Ta), 11', is provided on layer 11 as a starting material to be used in connection with the subsequent provision of ferromagnetic material shields such as through providing a permalloy material (the remainder is shown in FIG. 2A following etching to form those shields as described below).

A 2 μm shield layer of nickel iron alloy (NiFe), comprising 80% nickel and 20% iron, is sputter deposited on tantalum layer 11'. Then, as a basis for forming a mask to pattern this shield layer into magnetic field shields to provide magnetic shielding in connection with a subsequently provided coil and field sensors, a 500 Å thick layer of silicon nitride is provided on the shield layer and patterned using well known methods to form a mask covering the shield layer where shields are to be provided. The remaining exposed shield layer material is etched away to leave a pair of shields, 12, having a silicon nitride masking layer, 12', thereupon.

Next, a 2 μm thick electrical insulating coil support layer, 13, is provided using a positive photoresist polymer material, the material being B-staged bisbenzocyclobutene (BCB) which is spun on over the shields present intermediate device structure to cover shields 12 still supporting the masking silicon nitride layer 12', and to also cover the remaining exposed portions of tantalum layer 11'. This polymer material based layer is then heated to 250° C. in a hard curing step so that it thereafter exhibits sufficient mechanical stiffness to accommodate subsequent steps in the fabrication process to further fabricate the device.

A mechanically stiff layer is next needed to be provided on deformable polymer coil support layer 13 to provide a firmer base for better supporting the input conductor coil to be next provided, and for supporting the bonding pads formed integrally with this coil (thereby subsequently allowing external interconnections to be made through wire bonding to this input conductor coil) while also adhering this coil structure well to base polymer layer 13. Such a stiffening layer allows for successful wire bonding by limiting the movement in deformation of the bonding pad which otherwise would occur as layer 13 thereunder to deforms during wire bonding operations under the pressure applied in such operations. Thus, a further silicon nitride layer, 13', is provided by sputter deposition to a thickness of 5000 Å as such a stiffening layer on support layer 13.

Directly thereafter, a 2 μm layer of unalloyed aluminum is sputter deposited onto silicon nitride stiffening layer 13' from which to form the input conductor coil and its bonding pads. Photoresist is then provided over this aluminum layer to be formed into an etch mask, and patterned for this purpose using well known methods so as to leave portions thereof at locations where the input conductor coil and the bonding pads integral to this coil are to result. Reactive ion etching is used to remove the unmasked and unwanted portions of the aluminum so as to leave a coil, 14, and its integrally formed bonding pads, 14', the latter being shown in dash line form in not being at the surface through which the section is taken in FIG. 2A. Thereafter, a protective layer, 14'', of 5000 Å thick silicon nitride is deposited over coil 14, coil bonding pads 14' and the exposed surfaces of silicon nitride stiffening layer 13', this protective layer being provided to offer further stiffening and prevent water vapor transfer. The portion of this last provided silicon nitride layer that is over coil bonding pads 14' is not indicated in FIG. 2A.

Upon completion of silicon nitride protective layer 14'', a 6.5 μm positive photoresist polymer material layer is spun on over this protective layer. This spun on layer then is cured at a temperature 250° C. to provide a hardened polymer layer, 15. Layer 15 is the primary high voltage isolation layer for the isolator and therefore must exhibit a high breakdown voltage, and with low water absorption in support of this requirement. Layer 15 should also improve the planarization of the resulting outer surface of this layer relative to the surfaces on which it is formed, and it should adhere well to those surfaces. Again, this polymer layer needs to exhibit sufficient mechanical stiffness to permit subsequent operations in completing the fabrication of the device. The glass transition temperature of layer 15 must be sufficiently high to exceed temperatures reached during thermosonic bonding. Here too, the photoresist material BCB is chosen as a basis of providing layer 15.

Again, a mechanically stiff layer is then needed to be provided on deformable polymer dielectric layer 15 to yield a firmer base for supporting the structures to be provided in the remaining fabrication steps in forming the final device. Thus, a silicon nitride layer, 15', is provided by sputter deposition to a thickness of 200 Å onto primary insulating layer 15 to serve as a base for the current sensor structures to be next provided.

The current sensor "sandwich" structure to be provided for the current sensor just mentioned is started with a compatible base metal layer, 16, shown as the next to bottom layer in FIG. 2B which provides a fragmentary view of such a sensor structure. This base layer is formed by sputter depositing a layer of primarily β-phase tantalum on layer 15'. Layer 16 is typically deposited to a thickness of 40 Å as a buffering base layer for supporting a subsequent ferromagnetic material layer in the "sandwich" structure current sensor to subsequently be formed thereon, this layer to prevent material diffusion between that "sandwich" structure and silicon nitride layer 15' below.

Upon buffer layer 16 is then deposited a 32.5 Å thick permalloy, or NiFe, layer, 17, to serve in the final current sensor "sandwich" structures as an added augmenting, interacting ferromagnetic material "free" layer. Layer 17 is deposited in the presence of a magnetic field having a magnitude of 20 Oe in an initial selected direction to orient the induced easy axis of this layer in that direction.

A 45 Å thick tantalum spacer layer, 18, is next deposited on interacting "free" layer 17 to separate that layer from the next ferromagnetic material layer. That next layer, a 42.5 Å thick permalloy, or NiFe, layer, 19, is deposited on spacer layer 18, layer 19 to serve, after the etching to form the current sensor from these layers, as part of the sensing ferromagnetic material "free" layer in that sensor. The deposition of layer 19 is followed by depositing thereon a 10 Å thick cobalt iron, or CoFe, magnetoresistance enhancement layer, 20, on layer 19 as the remainder of the sensing "free" layer, thus formed as composite layer, with both of these last two layers being deposited in the presence of a magnetic field having a magnitude of 20 Oe in the initial selected direction indicated above.

A copper layer, 21, that is 27.5 Å thick is then deposited on composite sensing "free" layer 19, 20 to form a nonmagnetic, electrically conductive intermediate layer for this "giant magnetoresistive effect" device. Another cobalt iron layer, 22, is deposited to a thickness of 42.5 Å as the "pinned" layer in being part of what will become a magnetization direction reference layer structure after the device formation etching, this layer being deposited in the presence of a magnetic field with a magnitude of 20 Oe which can either be oriented in the initial selected direction indicated above or in a direction perpendicular thereto, here typically being the latter. Layer 22 has its magnetization direction "pinned" by depositing thereon an antiferromagnetic material to form a "pinning" layer, 23, as the remainder of the reference layer structure, also in the presence of a magnetic field with a magnitude of 20 Oe directed parallel to the magnetization direction chosen for layer 22. Layer 23 has for the antiferromagnetic material therein chrome platinum manganese, or CrPtMn, deposited to a thickness of 325 Å.

Thus, the magnetization direction reference layer is formed of "pinned" layer 22 and "pinning" layer 23 through exchange coupling therebetween to thereby establish a magnetization direction, even in the face of externally applied magnetic fields, in the finally formed magnetoresistors providing the current sensors for the isolator. A tantalum interconnection buffer layer, 24, is then provided on "pinning" layer 23 to a thickness of 50 Å to protect the magnetoresistive structure during subsequent fabrication steps, and to facilitate good electrical contact to the aluminum interconnection structures to be provided thereto.

This spin-valve current sensor is provided with second "free" ferromagnetic material layer 17 as contrasted with the usual single free layer in such a device. Composite "free" layer 19, 20 is the sensing layer which contributes to the sensor giant magnetoresistive effect response while second "free" layer 17 is an interacting layer which influences the performance of sensing layer 19, 20 but does not contribute to the sensor giant magnetoresistive effect response. This arrangement not only can significantly reduce the hysteresis of the composite free layer but also provides a means to adjust and optimize the bias point of this linear spin-valve sensor through suitably selecting the thickness of interaction layer 17.

Following provision of these layers to form the described stack, an annealing step is undertaken. The substrate and the stack are heated in the presence of a magnetic field with a magnitude of 3000 Oe in the initial selected direction with this field being maintained during one hour heating at 250° C. in forming gas, and during the subsequent cooling. This is done for the purposes of strengthening the pinning of layer 22 by layer 23, and for reducing the dispersion of the angular orientations of the easy axes from the initial selected direction, or the direction perpendicular thereto, over the extents thereof.

The magnetoresistor structures for the isolator current sensors are formed from this stack of deposited layers through a patterning etching process. An etching mask of silicon nitride is provided through using patterned photoresist as an initial etching mask for patterning the silicon nitride in a reactive ion etcher (RIE) and then using the resulting silicon nitride "hard mask" as an etching mask in an ion mill. The ion mill will remove all materials in the deposited electrically conductive layers not covered by the "hard mask" material, and so exposed to the etching, beginning first with the material in layer 24, not covered by the mask, and then in each layer below those portions of layer 24 are also etched away down to silicon nitride layer 15' to leave the crenelated magnetoresistor structures, i.e. the "sandwich" current sensor structures, 25, shown in FIGS. 1 and 2A. Much of the silicon nitride forming the hard mask is also removed in the ion milling step.

A passivating silicon nitride layer, 26, is sputter deposited over magnetoresistor structures 25 to a thickness of 5000 Å. Photolithography is used to form etching mask for using reactive ion etching to open contact holes in passivating layer 26 to magnetoresistor structures 25. Aluminum interconnection metal is sputter deposited over the remaining portions of passivation layer 26 and into the open contact holes over magnetoresistors 25 to a thickness of 2 μm. This aluminum layer is then patterned using a photoresist etching mask and reactive ion etching again to provide aluminum interconnections, 27. A final passivating layer, 28, of silicon nitride is provided by sputter deposition to a thickness of 1.5 μm which is omitted from being shown in FIG. 1. Aluminum interconnections 27 are shown in FIG. 1 ending, at those ends thereof not connected to crenelated magnetoresistor structures, or current sensor, 25, so as to each terminate in a corresponding one of four bonding pads in a left to right sequence in a lower part of the view therein across from coil 14 and those magnetoresistors. The outer two of these bonding pads are for supplying electrical current through the bridge circuit in which all four of magnetoresistors 25 are connected, each in a different "leg" thereof, and the inner two of these bonding pads are the output signal provision locations for the bridge circuit, and hence for the signal isolator.

A masking layer 1000 Å thick of aluminum nitride (AlN) is then sputter deposited over layer 28 and patterned using well known photolithography methods. The patterning provides an opening in the aluminum nitride mask over the bonding pads 14' through which an etching step is undertaken by reactive ion etching to remove the exposed corresponding portions of silicon nitride layers 28, 26 and 15', and then the corresponding portion of primary insulating layer 15, and finally protective layer 14" to complete via openings, 29, to bonding pad 14'. The aluminum nitride mask portions remaining after the patterning of the precursor layer are also removed in a subsequent wet chemical etching process.

Again, an annealing of the resulting magnetoresistors is performed, first, in the presence of a magnetic field with a magnitude of 3000 Oe in the initial selected direction now along the lengths of the magnetoresistors with this field maintained during a one hour heating at 240° C. in forming gas and during the subsequent cooling to reduce the dispersion of the angular orientations of the easy axes from the lengths of the magnetic material layers over the extents thereof. A further annealing step follows in the presence of a magnetic field with a magnitude of 3000 Oe perpendicular to the initial selected direction, and so along the widths of the resulting magnetoresistors, with this field maintained during a two hour heating at 240° C. in forming gas, and then at 265° C. for one hour, to reorient the pinned direction of layer 26 to be along with width of the magnetoresistors.

The annealing is completed in a further step in the presence of a magnetic field with a magnitude of 3000 Oe parallel to the initial selected direction, and so along the lengths of the resulting magnetoresistors, with this field maintained during a two hour heating at 160° C. in forming gas and during the subsequent cooling to reduce the dispersion of the angular orientations of the easy axes in free layer 24 from the initial selected direction over the extent thereof but at a reduced temperature to avoid affecting the direction of pinning set in layers 26 and 27. These last two annealing steps result in a pinning direction orientation at some relative angle to the widths of the magnetoresistors to thereby provide a component of the interlayer coupling along the lengths thereof to provide some bias to aid in minimizing the device hysteresis.

Completion of these fabrication steps on the wafer leaves the "dicing" of the wafer to yield the individual signal isolators which are then mounted on an isolator lead frame. Typically, the isolator coupled output signal is provided to a receiver integrated circuit chip provided on a separate receiver lead frame with wire bonds extending from the four interconnections 27 bonding pads, i.e. the bridge circuit formed by interconnected magnetoresistors 25, to the receiver chip circuitry. The outer two of these pads through which operating current is supplied to the bridge circuit would optionally not have to be wire bonded to the receiver chip but could, instead, be bonded to current supply points provided in the receiver lead frame arrangement to avoid having such currents in that chip.

This assembly of the two lead frames supporting the wire bond interconnected isolator and receiver chips is typically encapsulated in a plastic housing to complete the signal isolator system. In a further alternative, rather than having the input being a wire bond from a lead frame pin to which pin an external signal source is coupled, a further transmitter monolithic integrated circuit chip can be provided containing circuitry that provides suitable signal conditioning to input signals received from an outside signal source to thereby supply suitable signals for operating coil 14. This transmitter chip has wire bond interconnections with coil 14 on the isolator chip, and can be provided on the same lead frame on which the isolator chip is provided while still leaving them both isolated from the receiver chip. Of course, such a transmitter chip can be provided on a third lead frame that is in a common assembly with the other two all housed by a common mass of encapsulating plastic.

Figure 3:
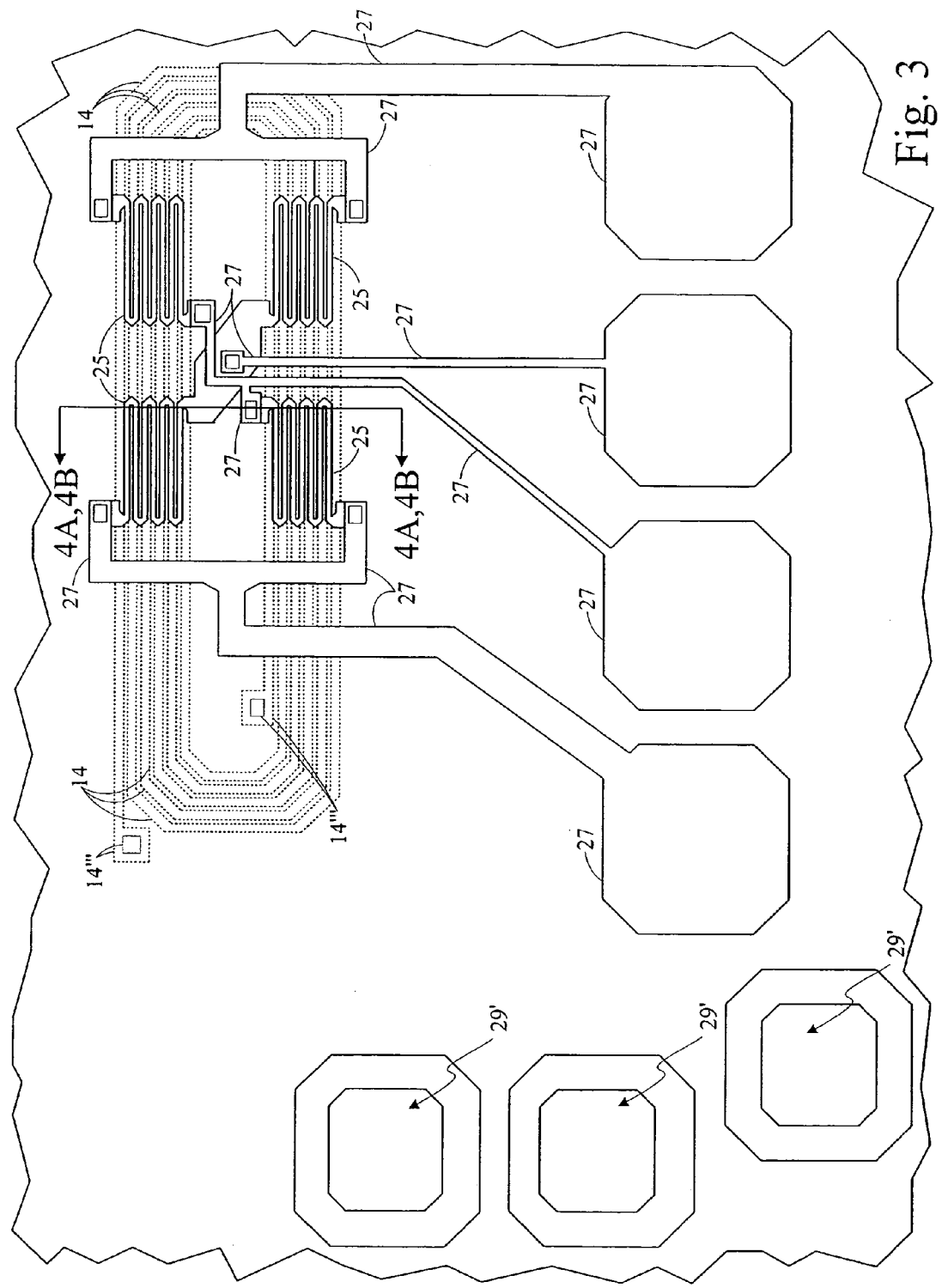
FIG. 3 is a plan view of a portion of an alternate monolithic integrated circuit structure embodying the present invention.

Alternative to the structure shown in FIGS. 1 and 2, coil 14 can be more conveniently and more uniformly provided as part of the last metallization interconnection layer provided in a monolithic integrated circuit chip serving as a substrate for the remainder of the signal isolator device as well as providing the operating circuitry therefor. Further, there is then no need for large bonding pads 14' for coil 14 required to be provided beneath polymer insulating layer 15 since the coil is interconnected to the operating circuitry in the chip thereby allowing a reduction in chip surface area. Such an arrangement is shown in FIG. 3 where portions thereof that are closely similar to portions in FIG. 1 retain the same numerical designations in FIG. 3 they had in FIG. 1.

Bonding pads 14' of FIGS. 1 and 2 are shown replaced in FIG. 3 by interconnections, 14''', extending through via openings in the integrated circuit insulation layer supporting coil 14 and other structures therein below that insulation layer to connect coil 14 to the circuitry in the monolithic integrated circuit chip of the substrate. Thus, coil 14 is interconnected with the integrated circuitry entirely under polymer insulating layer 15 thereby eliminating the need for vias 29.

On the other hand, electrical power and an interconnection to an external input signal source are required by the integrated circuitry within the monolithic integrated circuit chip both for the operation of that circuit, and for the supply of information signals to be coupled from the input of the signal isolator to the output thereof across the isolation barrier. Thus, further vias, 29', are shown in FIG. 3 extending from the system outer surface to bonding pads in the integrated circuit chip to allow for thermosonic wire bonding from chip housing terminals to those bonding pads in the monolithic integrated circuit to provide interconnections for supplying positive and negative operating voltage to the monolithic integrated circuit chip and further supplying input signals to be coupled to the signal isolator output.

Such an arrangement, however, makes providing shields 12 of FIGS. 1 and 2, positioned there between coil 14 and substrate 10, infeasible due to the required thickness thereof. One arrangement for an alternative magnetic shield is to provide a shielding layer of ferromagnetic metal material such as permalloy that is plated onto the side of the semiconductor chip containing the monolithic integrated circuit for operating the isolator that is opposite that on which the coil is provided, although this can be a difficult fabrication to achieve a suitably aligned shield. Other possibilities are indicated in the layer diagrams of FIGS. 4A and 4B, taken in the alternative from FIG. 3 as indicated in that figure, showing magnetic shielding being provided by either the lead frame on which the semiconductor integrated circuit chip including the signal isolator portions thereof is mounted for use (which would require that frame to be made of a ferromagnetic material), or by a ferromagnetic material plate attached to a typical commercially available lead frame on which the chip is mounted for subsequent use.

Once a monolithic integrated circuit wafer including the individual chip circuits is available with each including a coil 14 therein, the fabrication of the remainder of the signal isolator system is completed essentially as above but starting at the point in the fabrication process at which insulating polymer layer 15 in FIGS. 1 and 2 is provided. Those portions of FIGS. 4A and 4B closely similar to portions shown in FIG. 2A retain the same numerical designations in FIGS. 4A and 4B as they had in FIG. 2A.

Figure 4A:
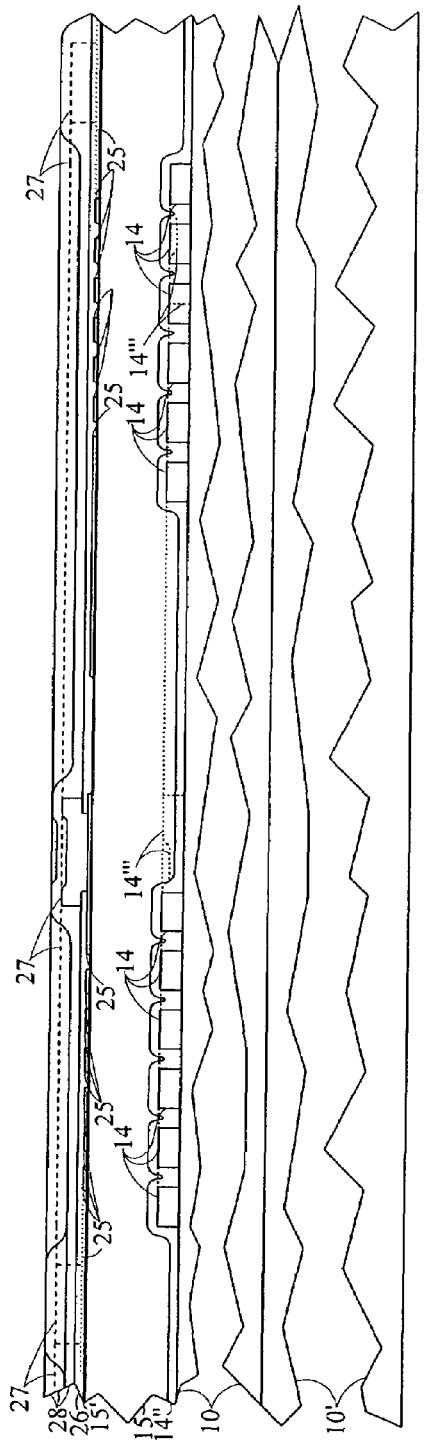
FIGS. 4A and 4B are alternative layer diagrams of parts of the structure portion shown in FIG. 3 as mounted.
Figure 4B:
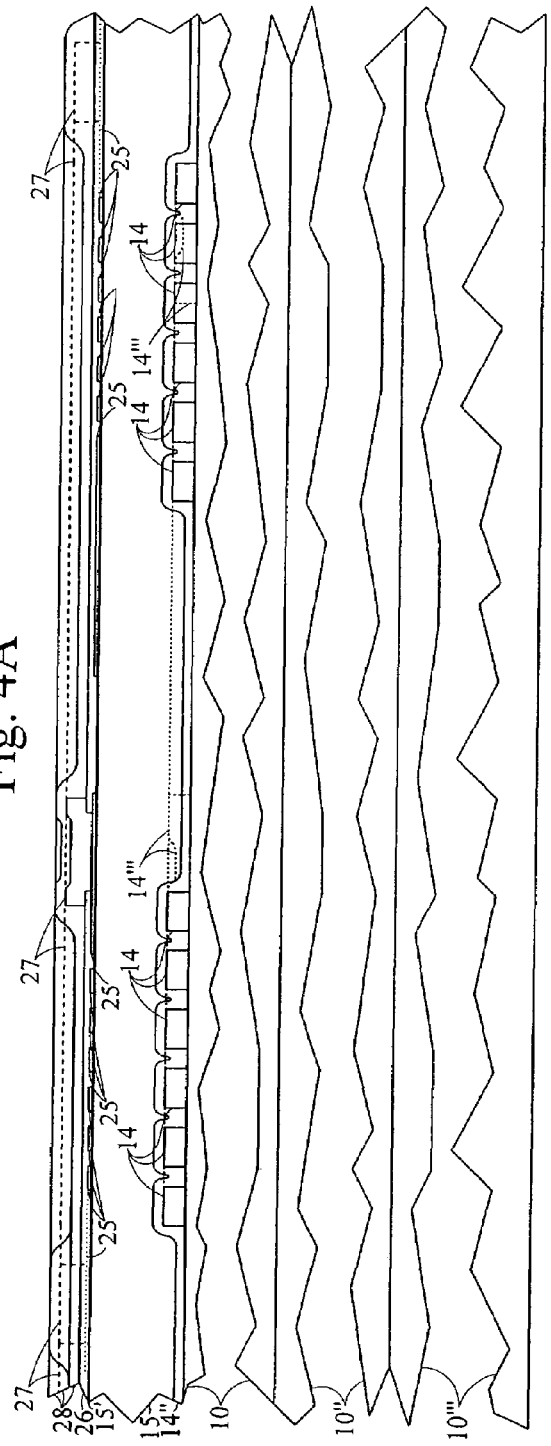

In FIG. 4A, the numerical designation 10 refers to the entire substrate including the semiconductor chip containing the monolithic integrated circuit and the last electrical insulating layer below the metallization layer from which coil 14 is formed along with coil integrated circuit interconnections, 14'''. The same situation is shown in FIG. 4B. In each of these figures, substrate 10 is supported on a lead frame which in FIG. 4A is a lead frame, 10', made of permalloy, and which in FIG. 4B is a typical commercially available lead frame, 10'', that is, an ordinary copper alloy lead frame commercially available. In this latter instance in FIG. 4B, however, a further layer is shown comprising a permalloy material shield, 10''', which is affixed beneath lead frame 10''.

Figure 5:
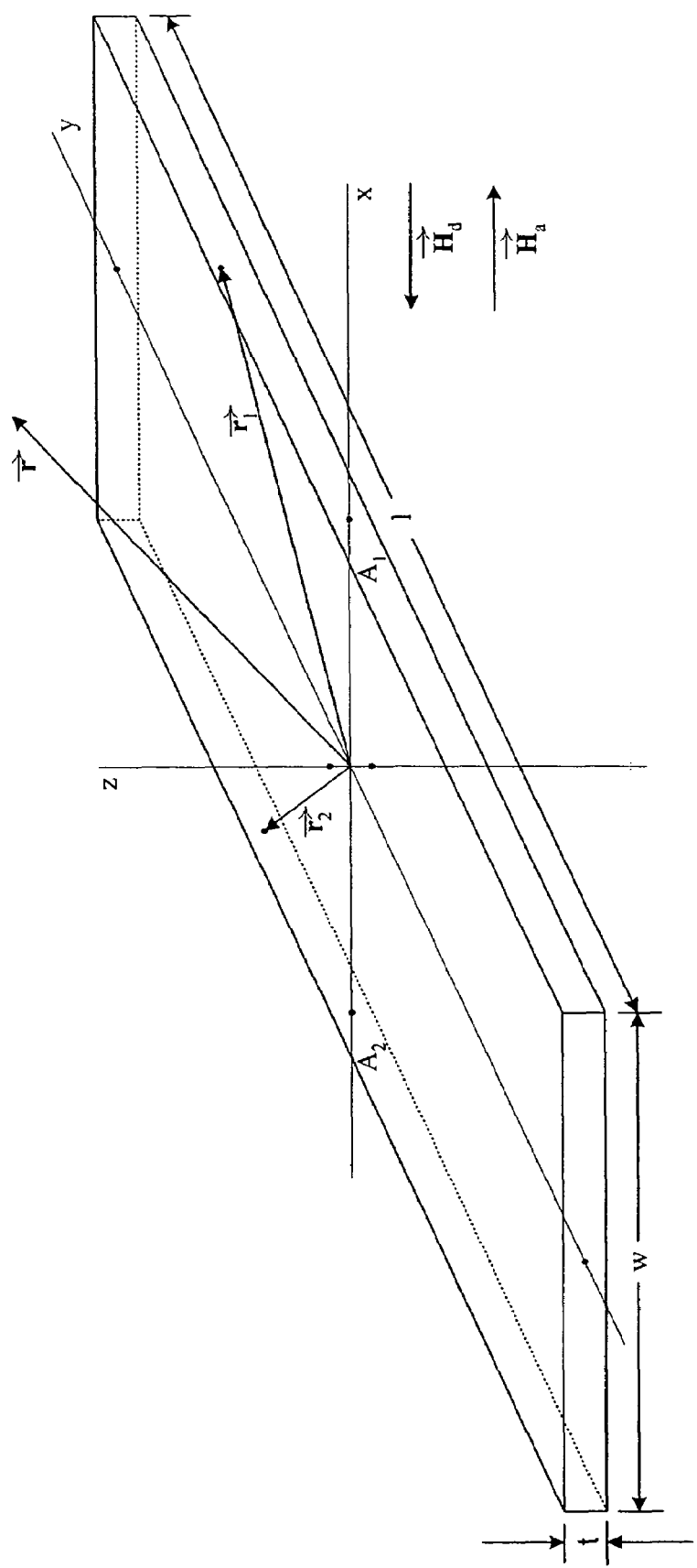
FIG. 5 represents an approximation of a portion shown in the FIG. 2A layer structure in a coordinate space.

The occurrence or application of a magnetic field external to the signal isolator system as supported on a substrate will cause the magnetization of the magnetically permeable material in any of these shields to rotate toward aligning with this external field, and this realigned magnetization will result in a demagnetization field being established by the shield material in this situation. The tendency of this demagnetization field to cancel the external field in adjacent regions along perpendiculars to the external field provides the shielding effect with respect to that external field in those regions. FIG. 5 shows an approximation to a plate-like shield structure which allows estimating the magnitude of the demagnetization field $H_d$ in the regions adjacent to the wide sides of the plate in the situation of an external uniform magnetic field of magnitude $H_a$ being applied. Such an external field will lead to a magnetic surface charge density $\sigma(\vec{r}_n)$ occurring on areas $A_1$ and $A_2$ (n=1,2) in the absence of any bulk charge in the shield to give rise to a corresponding demagnetization field which can be determined from $$H_d(r) = \int_{A_1} \frac{\sigma(\vec{r}_1)}{|\vec{r}-\vec{r}_1|^2} dA_1 + \int_{A_2} \frac{\sigma(\vec{r}_2)}{|\vec{r}-\vec{r}_2|^2} dA_2.$$

The magnetic surface charge density for a uniform magnetic field $H_a$ will be constant of a value $\sigma$ on each of surfaces $A_1$ and $A_2$, though of opposite polarity, and so the preceding equation can be written in Cartesian coordinates as $$H_d(x,y,z) = \int\int \frac{\sigma[(x-x_1)\vec{e}_x + (y-y_1)\vec{e}_y + (z-z_1)\vec{e}_z]}{|(x-x_1)^2+(y-y_1)^2+(z-z_1)^2|^{3/2}} dy_1 dz_1 - \int\int \frac{\sigma[(x-x_2)\vec{e}_x + (y-y_2)\vec{e}_y + (z-z_2)\vec{e}_z]}{|(x-x_2)^2+(y-y_2)^2+(z-z_2)^2|^{3/2}} dy_2 dz_2$$

where $\vec{e}_x$, $\vec{e}_y$, and $\vec{e}_z$ represent unit vectors along the coordinate system axes and $x_1$, $x_2$, $y_1$, $y_2$, $z_1$ and $z_2$ represent the coordinate extent limits of the plate-like shield structure or w/2, -w/2, l/2, -l/2, t/2 and -t/2, respectively. If the shield is taken as extending so far in its length along the y axis from the region to be shielded as to be reasonably considered to be of infinite length as is usually approximately true, the foregoing equation can be integrated over y so as to remove the y coordinate dependency giving $$H_d(x,z) = 2\sigma\int_{-\frac{t}{2}}^{+\frac{t}{2}} \frac{(x-x_1)\vec{e}_x + (z-z_1)\vec{e}_z}{(x-x_1)^2+(z-z_1)^2} dz_1 + 2\sigma\int_{-\frac{t}{2}}^{+\frac{t}{2}} \frac{(x-x_2)\vec{e}_x + (z-z_2)\vec{e}_z}{(x-x_2)^2+(z-z_2)^2} dz_2$$

where the extent of the thickness along the z axis is indicated in the limits of the integrals. Integrating the terms in which the numerator has z or $z_1$ within it leads to results in the two integrals that cancel one another leaving $$H_d(x,z) = 2\sigma\int_{-\frac{t}{2}}^{+\frac{t}{2}} \frac{(x-x_1)\vec{e}_x}{(x-x_1)^2+(z-z_1)^2} dz_1 + 2\sigma\int_{-\frac{t}{2}}^{+\frac{t}{2}} \frac{(x-x_2)\vec{e}_x}{(x-x_2)^2+(z-z_2)^2} dz_2.$$

Since the x terms are not involved in the above integration, the x coordinate dimension limits of $x_1$=w/2 and $x_2$=-w/2 can be inserted to give $$H_d(x,z) = 2\sigma\int_{-\frac{t}{2}}^{+\frac{t}{2}} \frac{\left(x-\frac{w}{2}\right)}{(z-z_1)^2+\left(x-\frac{w}{2}\right)^2} dz_1 + 2\sigma\int_{-\frac{t}{2}}^{+\frac{t}{2}} \frac{\left(x+\frac{w}{2}\right)}{(z-z_2)^2+\left(x-\frac{w}{2}\right)^2} dz_2.$$

This expression can then be integrated to yield $$H_d(x,z) = 2\left(x-\frac{w}{2}\right)\sigma\left[\frac{1}{x-\frac{w}{2}}\tan^{-1}\frac{(z_1-z)}{x-\frac{w}{2}}\right]_{-\frac{t}{2}}^{+\frac{t}{2}} - 2\left(x+\frac{w}{2}\right)\sigma\left[\frac{1}{x+\frac{w}{2}}\tan^{-1}\frac{(z_2-z)}{x+\frac{w}{2}}\right]_{-\frac{t}{2}}^{+\frac{t}{2}}$$

or, after evaluating, $$H_d(x,z) = 2\sigma\left[\tan^{-1}\frac{z+\frac{t}{2}}{x-\frac{w}{2}} - \tan^{-1}\frac{z-\frac{t}{2}}{x-\frac{w}{2}}\right] - 2\sigma\left[\tan^{-1}\frac{z+\frac{t}{2}}{x+\frac{w}{2}} - \tan^{-1}\frac{z-\frac{t}{2}}{x+\frac{w}{2}}\right].$$

This equation can be used to show that two shields of 2.0 µm thick permalloy which saturate in a field of 160 Oe provide adequate shielding in the arrangement provided for the signal isolator of FIG. 2A. There is, of course, more freedom to add to the size of the shields in FIGS. 4A and 4B as the shields there are formed without the limitations encountered in providing shielding using integrated circuit fabrication process as was done in providing the structure of FIGS. 1 and 2A.

FIGS. 1 through 4 show, as indicated above, signal isolators with the main device structural components, beginning with a shield, either on the chip or the lead frame, followed by a planar coil, an insulating layer and then magnetoresistors as current sensors, these components stacked in that order on the supporting substrate. As stated above, this is a reverse of the stacking order for these main device structural components that had previously been used. However, rather than forming a signal isolator from these main device structural components in just one of these orders or the other to couple signals past an isolation barrier to the magnetoresistors output circuit, plural signal isolators can be jointly formed in a single isolator chip structure that will then allow bidirectional transmissions between two communicating entities. This requires that such an isolator chip have at least two signal isolators therein each formed using a different one of these device structural component orders so that a transmitter and a receiver for each entity can be provided in common on a chip that is on the same side of the isolation barrier but across that barrier from the other entity having its transmitter and receiver provided in a different chip.

The use of the two different stacking structures in the two signal isolators aids in keeping the main device structural components of each separated by layers from one another to maintain good electrical isolation therebetween. Further, the use of two different stacking structures positions the input of one isolator near the output of the other which together will be connected to the same one of two communicating entities in typical operation and so are likely to have a relatively small voltage difference therebetween to again to aid in maintaining good electrical isolation between isolator components.

Such an arrangement allows such an isolator chip along with a transmitter-receiver chip to each be housed on a corresponding one of two lead frame portions provided in some housing, separated and so electrically isolated from one another, to thereby provide bidirectional coupling of input signals to isolated outputs between the two communicating entities while keeping them electrically isolated from one another. That is, the input and output of one communicating entity are connected to the output and input of one transmitter-receiver chip wire bonded to the isolator chip, and the input and output of the other of these two communicating entities is connected to the output and input of the transmitter and receiver provided on the isolator chip or, alternatively, provided on another transmitter-receiver chip again wire bonded to the isolator chip.

Figure 6:
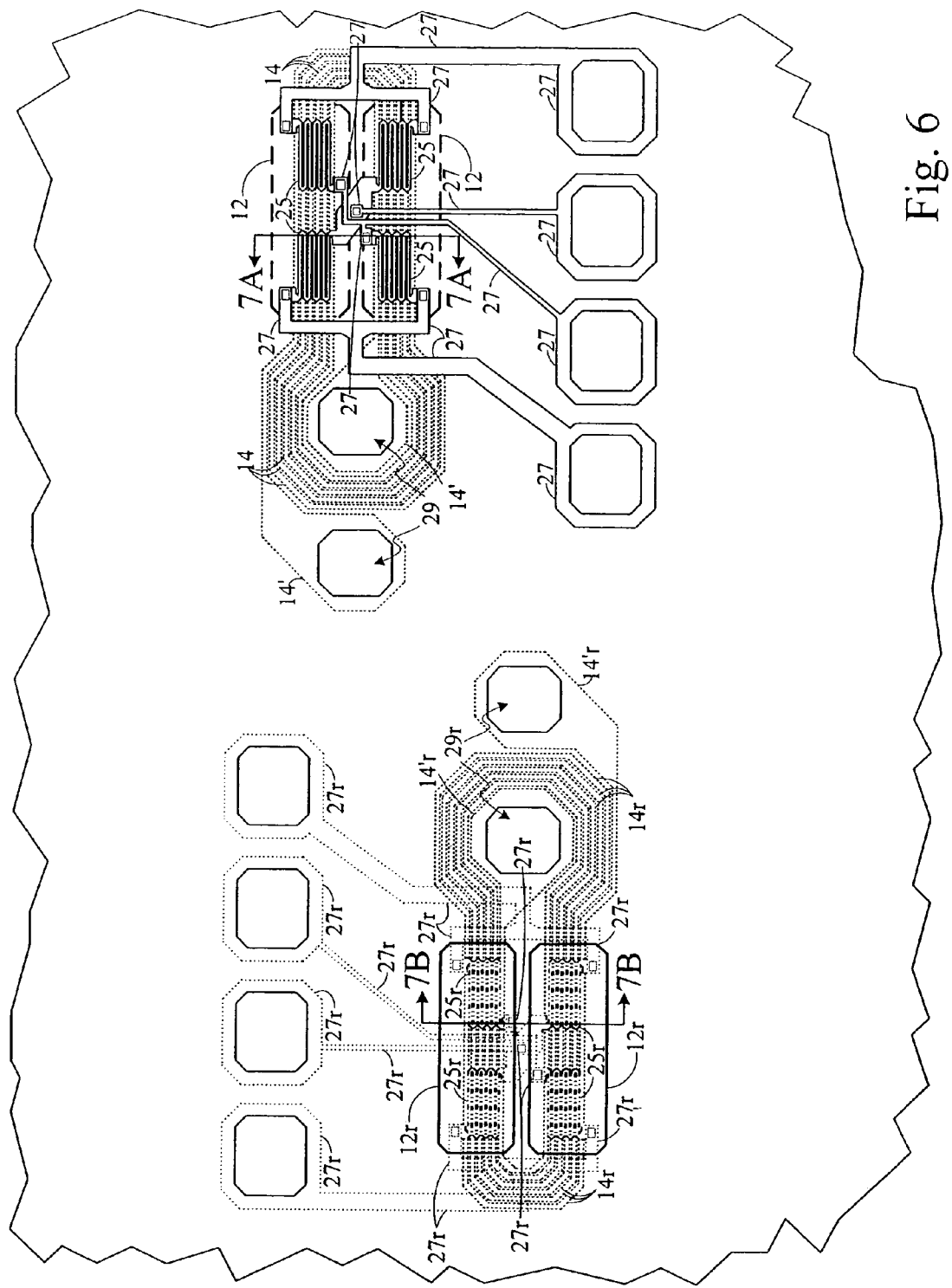
FIG. 6 is a plan view of a portion of an alternate monolithic integrated circuit structure embodying the present invention.

Such an isolator chip is shown in the fragmentary plan view thereof in FIG. 6 formed on a ceramic or silicon substrate as is done with the signal isolator of FIGS. 1, 2, 3 and 4 again with the outer protective or passivating layer not being shown. The signal isolator shown on the right in FIG. 6 is generally similar to the one shown in FIG. 1, or is essentially so, as can be seen in comparing the corresponding layer diagram of FIG. 7A with that of FIG. 2A. The signal isolator on the left in FIG. 6 is formed using the main device structural component stacking sequence used heretofore having the magnetoresistors, or current sensors, nearest the substrate followed by an insulating barrier layer and then the coil and shields as shown in the layer diagram of FIG. 7B.

Figure 7:
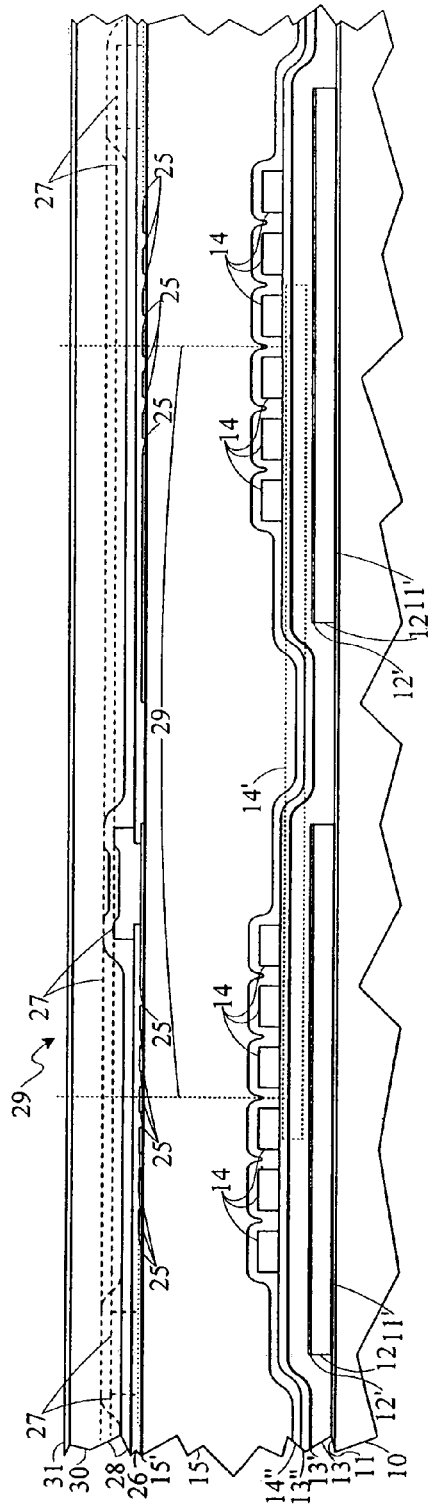
FIGS. 7A and 7B are layer diagrams of parts of the structure portion shown in FIG. 6.

The layers that are the same in each of the layer diagrams of FIG. 7A and FIG. 7B have the same numerical designation in each figure to thereby indicate they are commonly formed in the device fabrication process. The layers in FIG. 7A corresponding to similar layers in FIG. 2A have the same numerical designations there that they did in FIG. 2A, and are formed in essentially the same manner as in the device of FIG. 2A although some differences in layer thicknesses and other aspects are present. The signal isolator main device structural components including shield 12, coil 14, coil bonding pads 14' and magnetoresistors 25, and also metallization interconnections 27, retain the same designations in FIG. 7A they had in FIG. 2A. The counterparts to these components, provided in the stacking order shown in FIG. 7B that is reversed to that shown in FIG. 7A, have an "r" added thereafter in FIG. 7B to indicate they are for the reverse signal coupling direction in the isolator chip (and that the main components have the reverse stacking order on the substrate). This leads to FIG. 7B showing reversed stacking order position shields, 12r, a reverse coil, 14r, with bonding pads 14'r, and a set of reverse magnetoresistors, 25r, along with corresponding metallization interconnections, 27r.

Some additional layers are provided in the device of FIGS. 7A and 7B over those shown for the device in FIG. 2A because of the need to accommodate the provision of an added coil, i.e. to protect coil 14r, the provision of added shields, i.e. to provide a plating start layer for shields 12r, and the provision of added magnetoresistors and corresponding metallization interconnections, i.e. protecting magnetoresistors 25r and interconnections 27r. Thus, a further silicon nitride layer, 13", provided by sputter deposition to a thickness of 2500 Å is added for forming magnetoresistors 25r and interconnections 27r in FIG. 7B, and so this layer appears also in FIG. 7A even though not present in FIG. 2A because of the fabrication process being common to each device portion shown in FIGS. 7A and 7B.

Further, a 2 μm polymer electrical insulating layer, 30, is provided over layer 28 in FIG. 7B with the polymer material for this layer again being BCB. A stiffening layer of silicon nitride, 31, is then deposited on layer 30 with a thickness of 5000 Å. Finally, a 500 Å permalloy layer is provided as a plating start layer for having shields 12r plated thereon with just the remainders of that layer, 32, shown in FIG. 7B as remnants resulting after the etching of the shields following plating the layer therefor on the plating start layer.

The device of FIGS. 6, 7A and 7B is formed using three layers of electrical insulating polymer material BCB to thereby control uniformity of the separation between coils and their corresponding magnetoresistors well and uses just two added layers of metallization. As the kinds of fabrication process steps used here are the same as those used for forming the device of FIGS. 1 and 2, the fabrication process with be presented only in summary here. The fabrication process begins with forming shields 12, for the one signal isolator that is essentially the same as the device forming the FIG. 2A signal isolator, by sputter depositing permalloy therefor tantalum layer 11', and the wafer is then replanarized through providing the first layer of BCB that is 2.0 μm thick, layer 13. Silicon nitride is next deposited to a 500 Å thickness as base layer 13' for forming magnetoresistors 25r of the other isolator, this layer provision next followed by forming those magnetoresistors and part of the bridge circuit in which they are to be provided. After passivating magnetoresistors 25r with a silicon nitride layer 13" and opening windows therein, aluminum metal for interconnections 27r and metal for coil 14 is deposited, patterned and protected with further silicon nitride layer 14" that is 2,000 Å thick.

The primary isolation layer of BCB for both isolators is then spun on and cured as second BCB layer 15 to a 8.0 μm thickness followed by sputtering stiffening silicon nitride layer 15' to a thickness of 500 Å. Magnetoresistors 25, including part of the bridge circuit therefor, are provided as before and then passivated by sputtering thereon silicon nitride layer 26 to a thickness of 2500 Å. After opening vias to these magnetoresistors, a second layer of aluminum is deposited and patterned to provide coil 14*r* and interconnections 27 including completing the bridge circuit for these magnetoresistors. Protective layer 28 of silicon nitride is then sputtered on to a thickness of 2500 Å.

Final passivation with a third BCB layer 2.0 µm thick is provided through being spun on and cured by heating, this being layer 30, which is then covered by silicon nitride stiffening layer 31 to a depth of 5000 Å. A permalloy plating start layer is then deposited by sputtering to a thickness of 500 Å with permalloy shields 12*r* then being plated and patterned along with plating start layer 32. An aluminum nitride hard mask process is used to pattern the vias 29, 29*r* and those to the bridge circuits over the bonding pads made by metallization interconnections 27.

In the resulting device, coils 14 and 14*r* are separated by 8 µm of BCB for good electrical isolation but the electrical isolation between the two isolator main device structural component stacks must again be maintained through sufficient lateral spatial separation between those magnetoresistors and metal interconnections of one isolator and the coil of the other which are together provided separated in each instance by a silicon nitride layer 13" in the lower location instance in FIG. 7B and by silicon nitride layer 26 in the upper location instance in FIG. 7A. Separation can be reduced by thickening these silicon nitride layers or by substituting other, better, or additional, insulating material. Use of a suitable polymer material, such as BCB, allows omitting silicon nitride protective layers 14" and 28.

Figure 8:
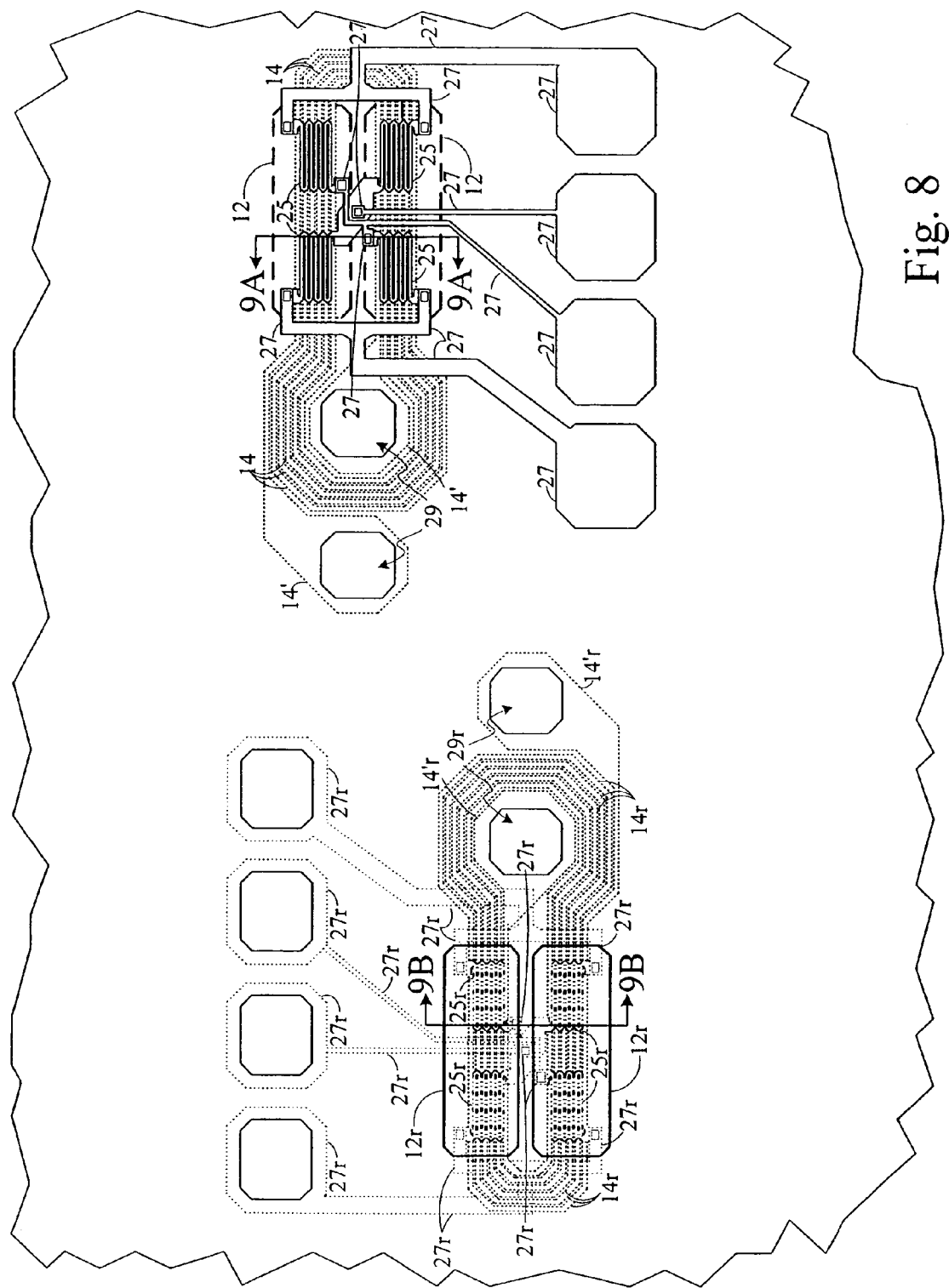
FIG. 8 is a plan view of a portion of an alternate monolithic integrated circuit structure embodying the present invention.

An alternative isolator chip, also having two signal isolators each with the main device signal components thereof stacked in opposite order again formed on a ceramic or silicon substrate, is shown in the fragmentary plan view of that chip provided in FIG. 8 with the outer protective or passivating layer once more omitted in that view for clarity. Here too, the signal isolator shown on the right in FIG. 8 is in essence similar to the signal isolator shown in FIG. 1, a situation that is reflected in the similarity between the layer diagram of FIG. 9A corresponding to FIG. 8 and that of FIG. 2A. The signal isolator on the left in FIG. 8 is shown in the corresponding layer diagram of FIG. 9B to have the main device structural components thereof in the stacking order used in signal isolators used heretofore, that is, with the magnetoresistors, or current sensors, being nearest the substrate and having an insulating barrier layer stacked thereon which in turn has a coil and shields stacked in that order on that barrier.

Figure 9A:
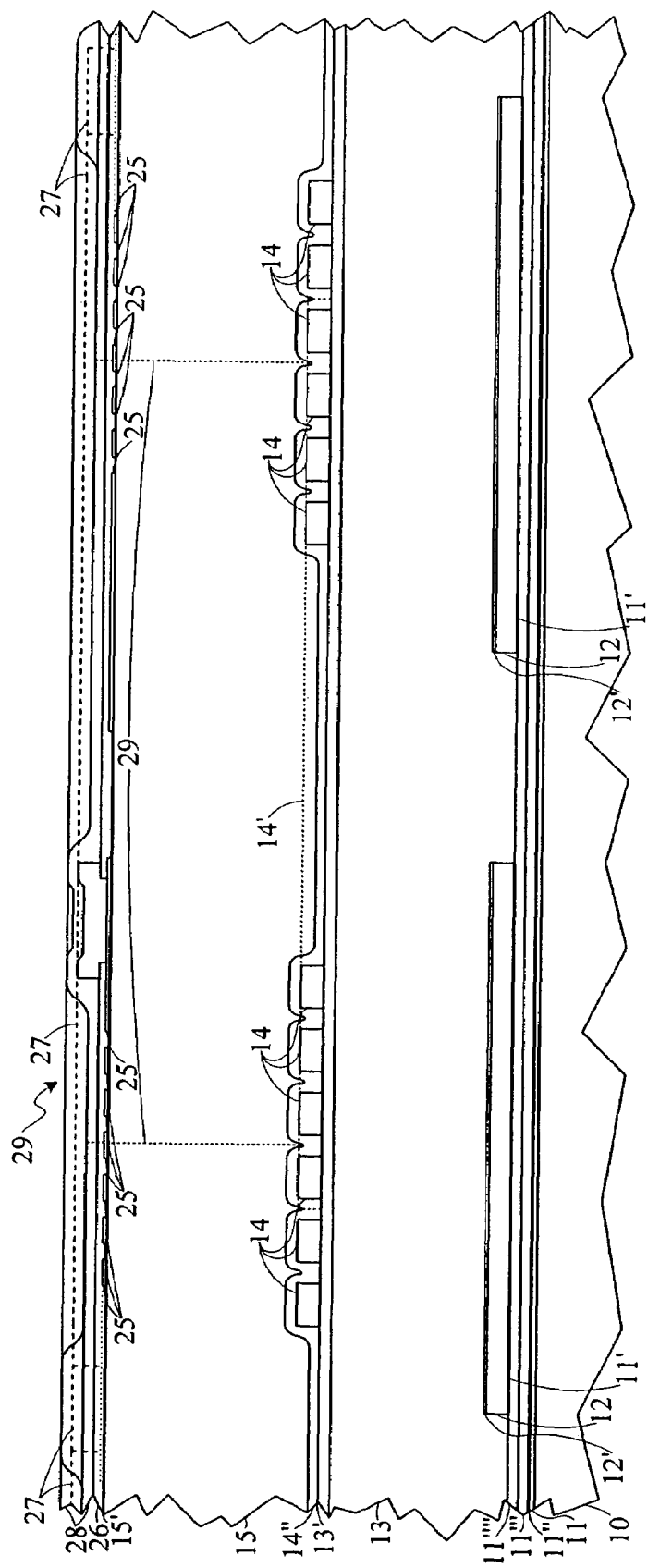
FIGS. 9A and 9B are layer diagrams of parts of the structure portion shown in FIG. 8.
Figure 9B:
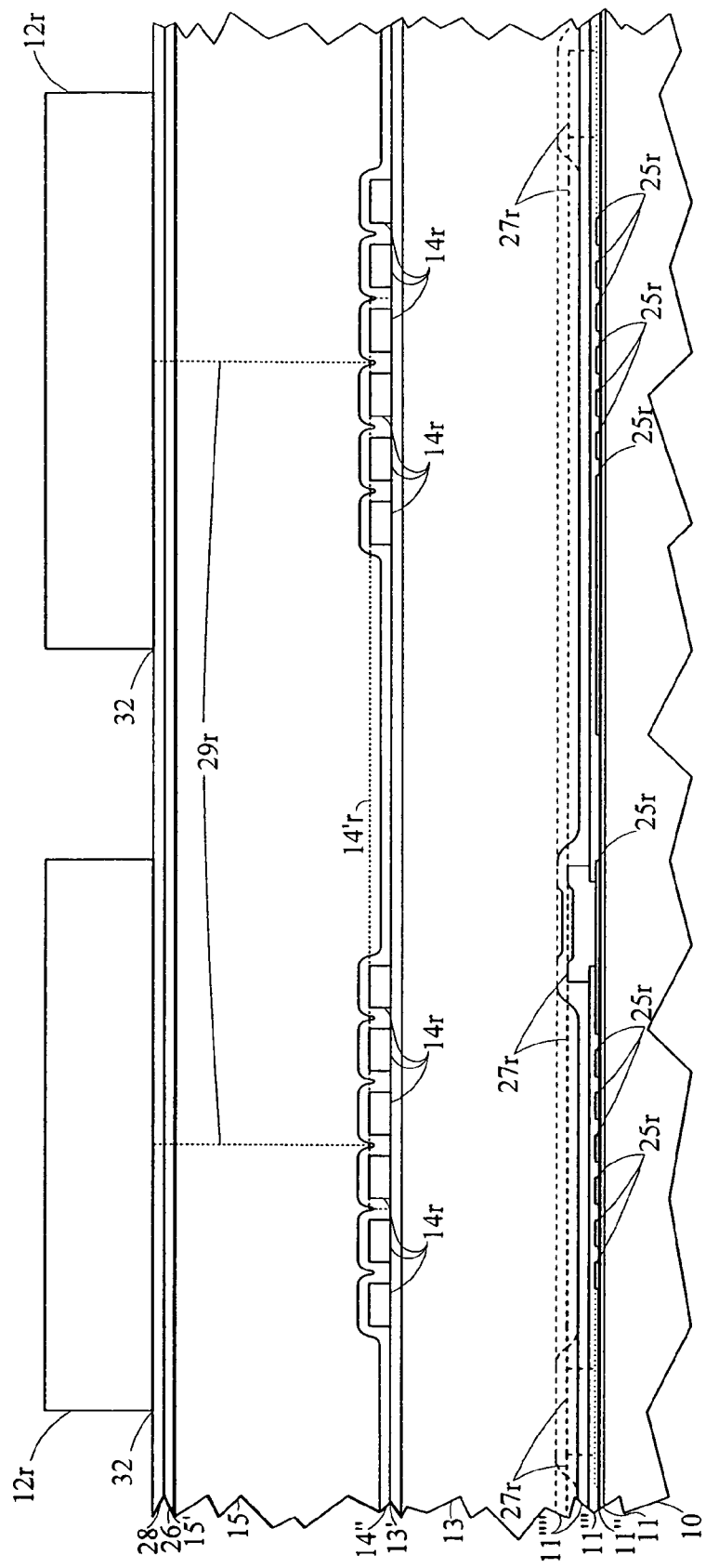

Again, the layers that are the same in each of the layer diagrams of FIGS. 9A and 9B have the same numerical designation in each of those figures, in view of them having been commonly formed in the device fabrication process, to thereby allow their relative positions in each portion of the isolator chip shown in those figures to be easily seen. The layers in FIG. 9A correspond to similar layers in FIG. 2A and so have been given the same numerical designations in this figure that they had in FIG. 2A. They are again formed in essentially the same manner as they are formed in the device of FIG. 2A although again with some differences in layer thicknesses and other aspects thereof being present.

The signal isolator main device structural components in FIG. 9A, shield 12, coil 14, coil bonding pads 14' and magnetoresistors 25 along with metallization interconnections 27, retain the same designations in that figure that were used for them in FIG. 2A (and also in FIG. 7A). The main device structural components for the signal isolator shown in FIG. 9B, being in the reverse stacking order on the substrate from those shown in FIG. 9A, again have an "r" added thereafter in FIG. 9B to indicate a stacking order and signal transmission direction reversal in this isolator as was done in FIG. 7B. Hence, FIG. 9B shows shields 12*r*, coil 14*r* and coil bonding pads 14'*r*, magnetoresistors 25*r* and corresponding metallization interconnections 27*r*.

This configuration also requires additional layers being provided in the device of FIGS. 9A and 9B beyond those shown for the device in FIG. 2A for again the same reasons of needing to accommodate the provision of added shields 12*r* and added magnetoresistors 25*r* along with corresponding metallization interconnections 27*r* though not for added coil 14*r*. Two further silicon nitride layers, 11''' and 11'''', are provided for forming magnetoresistors 25*r* along with interconnections 27*r* in FIG. 9B. These two layers appear also in FIG. 9A even though they are not present in FIG. 2A because of the fabrication process being common in each device portion shown in FIGS. 9A and 9B. These layers are each provided by sputter deposition to a thickness of 2000 Å. Again, a 500 Å permalloy layer is provided as a plating start layer as a basis for having shields 12*r* plated thereon with just the remainders of that layer, designated 32 as before, shown in FIG. 9B as remnants resulting from the etching process of the shields following plating the layer therefor on the plating start layer.

A 2000 Å thick silicon nitride layer 14" is provided over coil 14 just as in FIG. 2A, and also over coil 14*r* which are formed on the same silicon nitride layer 13', but here silicon nitride layer 13' is 2000 Å thick to provide a more stiffening support for these coils. Coils 14 and 14*r*, being provided on the common base of silicon nitride layer 13', must be kept relatively widely separated to be able to maintain good electrical isolation therebetween in view of the possibility they may each be operated at substantially different voltage levels. Adding another insulating layer over one coil as a base for forming the other to provide more insulating material between them can reduce such a separation spacing requirement.

A summary of the fabrication process for the two polymer material layer device of FIGS. 8, 9A and 9B begins with forming magnetoresistors 25*r* and part of the bridge circuit in which they are connected on 200 Å thick silicon layer 11" followed by sputter depositing a 3,000 Å thick silicon nitride passivating layer 11''' thereon. An aluminum interconnection layer 18,000 Å thick is next deposited and patterned to form interconnections 27*r*, which are then protected by a deposited 3,000 Å thick silicon nitride layer 11''''. Next, a 200 Å thick tantalum layer is deposited as the basis for supporting shields 12, and 2.0 µm of permalloy is sputtered thereon and patterned to form shields 12 and remnants 11' of the tantalum layer.

Polymer electrical insulating layer 13 is then spun on and cured by heating using again BCB to provide an isolation barrier 8.0 µm thick followed by sputter depositing silicon nitride stiffening layer 13' that is 2,000 Å thick to support coils 14 and 14*r*. Then 2.0 µm of aluminum is sputter deposited on this nitride layer for coils 14 and 14*r* and patterned. After protecting these coils with layer 14" of silicon nitride 2,000 Å thick (which again can be omitted for subsequent use of a suitable barrier layer polymer such as BCB), second polymer material isolation barrier layer 14 of BCB is spun on and cured to a thickness of 8.0 µm.

A 200 Å thick silicon nitride layer 15' is sputter deposited as a basis for forming magnetoresistors 25 and part of the bridge circuit in which they are connected. After passivating by sputter depositing 2,000 Å thick silicon nitride layer 26 and opening interconnection vias therein, an aluminum layer 18,000 Å thick is deposited and patterned to create interconnections 27 to complete the bridge circuit including providing signal runs from the bridge circuit junctions to bonding pads.

After final passivation layer 28 is provided by sputter depositing 2,000 Å of silicon nitride, a plating start layer 32 of 500 Å of permalloy is sputter deposited upon which shields 12*r* are then plated. An aluminum nitride hard mask is then used to open the vias to all of the bonding pads. Thus, three separate isolation zones are established by the use of two polymer material layer isolation barriers.

As seen in FIGS. 8 and 9B, vias 29*r* are provided to allow thermosonic wire bonds to be made to coil bonding pads 14'*r* of coil 14. The need to make such wire bonds through such relatively deep vias can be eliminated for the signal isolator of FIG. 9B by providing a portion of the interconnections of these pads to the outer surface region by opening vias to coil bonding pads 14'*r* before forming shields 12*r* and then providing these shields so as to also fill the vias to coil bonding pads 14'*r* with conductive metal joined to the shields thereby making the shields also the coil bonding pads.

Figure 10:
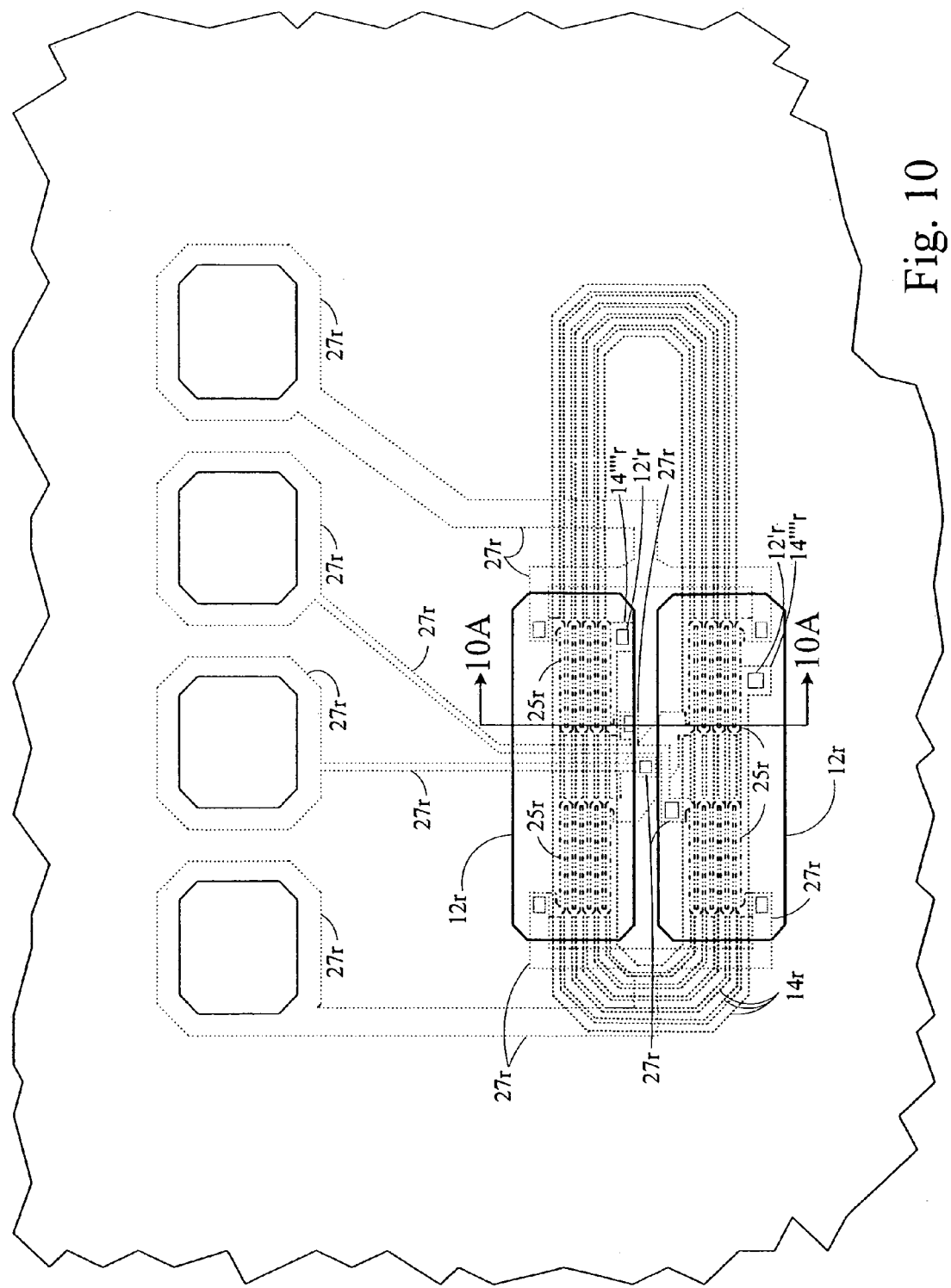
FIG. 10 is a plan view of a portion of an alternate monolithic integrated circuit structure embodying the present invention.
Figure 11:
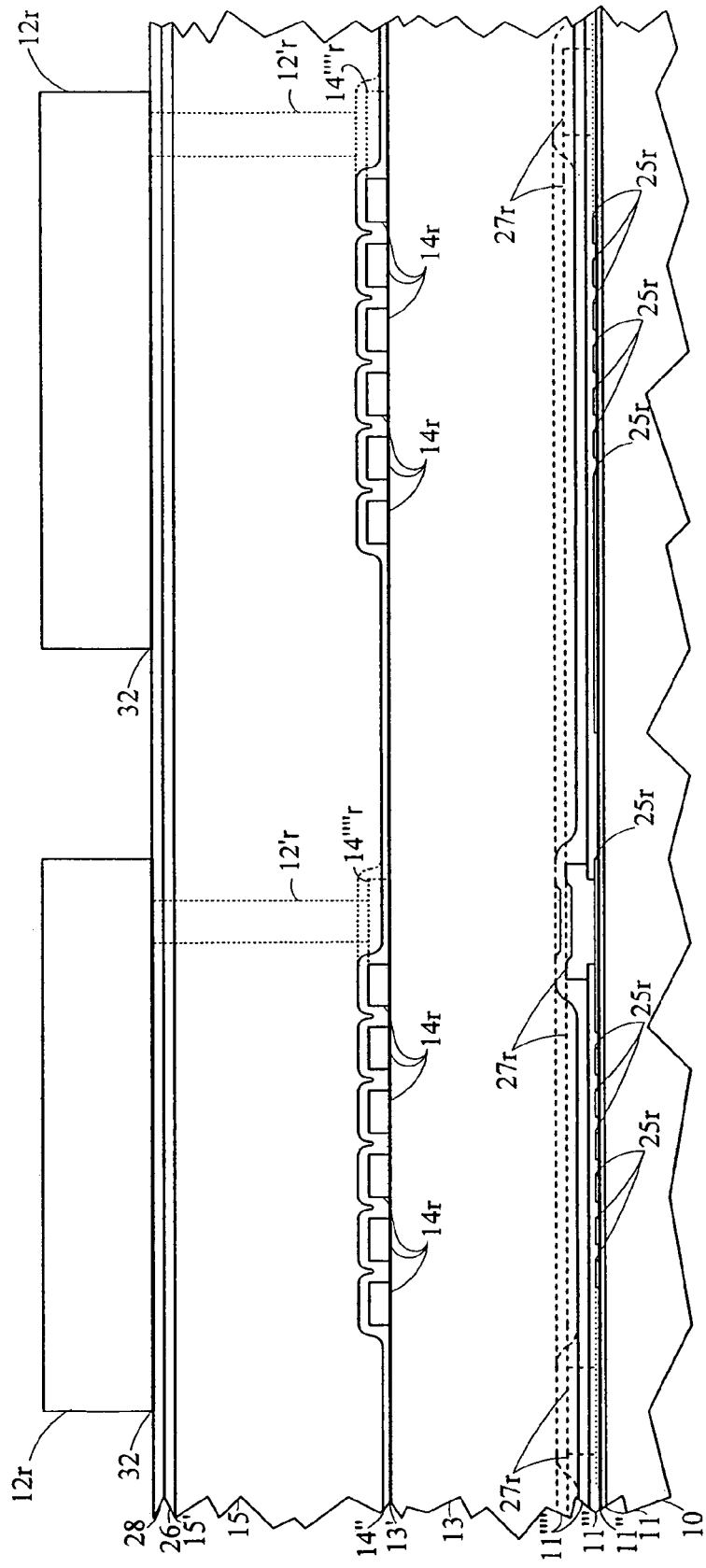
FIG. 11 is a layer diagram of part of the structure portion shown in FIG. 10.

Thus, as seen in the fragmentary plan view of FIG. 10, a chip portion is shown corresponding to the portion of the chip provided in FIG. 8 corresponding to FIG. 9B before the modification thereof now seen in FIG. 10. Coil bonding pads 14'*r* of FIG. 8 are gone, they being replaced in FIG. 10 by much smaller interconnection pads, 14''''. In the layer diagram of FIG. 11 corresponding to FIG. 10, an interconnection, 12'*r*, extends from each of shields 12*r* to a corresponding one of interconnection pads 14'''' so that these shields can be bonding pads for having thermosonic bonds thereon from which signal currents can be established therein and in interconnections 12'*r*, interconnection pads 14'''', and coil 14. Interconnections 12'*r* are provided by forming vias through plating start layer 32, silicon nitride layers 28 and 26, polymeric insulating material layer 15 and silicon nitride layer 14'', and then beginning and completing the plating of shields 12*r* which provides interconnections 12'*r* as well as shields 12*r*.

Although the present invention has been described with reference to preferred embodiments, workers skilled in the art will recognize that changes may be made in form and detail without departing from the spirit and scope of the invention.

The invention claimed is:

1. A current determiner for providing at an output thereof representations of input currents provided therein from sources of such currents, said current determiner comprising: a substrate; a first input conductor supported on said substrate suited for conducting said input currents therethrough; a first shield/concentrator layer of material exhibiting a substantial magnetic permeability and positioned adjacent but spaced apart from that side of said first input conductor facing said substrate to serve as a magnetic field concentrator; and a first current sensor supported on said substrate on a side of said first input conductor opposite that said side thereof facing said substrate so as to be adjacent to, yet spaced apart from, said first input conductor at an opposite side thereof to thereby be electrically isolated from any direct circuit interconnection therewith on said substrate but positioned in those magnetic fields arising from said input currents, said first current sensor being formed of a plurality of magnetoresistive, anisotropic, ferromagnetic thin-film layers at least two of which are separated from one another by a nonmagnetic layer positioned therebetween and also being free of any supplied biasing magnetic fields.

2. The apparatus of claim 1 wherein one of said at least two ferromagnetic thin-film layers has a magnetization that is substantially maintained in a selected direction despite said magnetic fields arising from said input currents causing reversals of direction of magnetization of that remaining one of said two ferromagnetic thin-film layers.

3. The apparatus of claim 2 wherein that one of said at least two ferromagnetic thin-film layers of said first current sensor having a magnetization that is substantially maintained in a selected direction has a higher effective coercivity than does said remaining one of said two ferromagnetic thin-film layers.

4. The apparatus of claim 3 further comprising an antiferromagnetic layer positioned at a major surface of that one of said two ferromagnetic thin-film layers of said first current sensor having a magnetization that is substantially maintained in a selected direction.

5. The apparatus of claim 2 further comprising an antiferromagnetic layer positioned at a major surface of that one of at least said two ferromagnetic thin-film layers of said first current sensor having a magnetization that is substantially maintained in said selected direction.

6. The apparatus of claim 2 wherein said first input conductor has its primary extent in a direction selected from substantially parallel to, and substantially perpendicular to, said selected direction.

7. The apparatus of claim 6 wherein said first input conductor is formed as a multiple turn coil having each said turn therein supported on a common surface.

8. The apparatus of claim 2 wherein said first current sensor is supported on said substrate spaced apart from said first input conductor at least in part by a polymeric electrical insulating material to thereby be electrically isolated from any direct circuit interconnection therewith on said substrate.

9. The apparatus of claim 8 wherein a stiffening layer is provided between said polymeric electrical insulating material and said first current sensor which stiffening layer is mechanically stiffer than said polymeric electrical insulating material.

10. The apparatus of claim 9 wherein said stiffening layer is formed of silicon nitride.

11. The apparatus of claim 2 wherein first input conductor is supported on said substrate spaced apart from said first shield/concentrator layer of material at least in part by a polymeric electrical insulating material to thereby be electrically isolated from any direct circuit interconnection therewith on said substrate.

12. The apparatus of claim 11 wherein said first input conductor is formed as a multiple turn coil having each said turn therein supported on a common surface.

13. The apparatus of claim 11 wherein a stiffening layer is provided between said polymeric electrical insulating material and said first shield/concentrator layer of material which stiffening layer is mechanically stiffer than said polymeric electrical insulating material.

14. The apparatus of claim 13 wherein said stiffening layer is formed of silicon nitride.

15. The apparatus of claim 11 wherein said first current sensor is supported on said substrate spaced apart from said first input conductor at least in part by a polymeric electrical insulating material to thereby be electrically isolated from any direct circuit interconnection therewith on said substrate.

16. The apparatus of claim 15 wherein said first input conductor is formed as a multiple turn coil having each said turn therein supported on a common surface.

17. The apparatus of claim 1 wherein said at least two ferromagnetic thin-film layers have magnetizations at least one of which changes in direction of magnetization due to said input currents with respect to that direction thereof occurring due to a biasing electrical current therethrough absent any said input currents occurring in said first input conductor.

18. The apparatus of claim 1 wherein one of said at least two ferromagnetic thin-film layers has a magnetization that is substantially maintained in a selected direction despite said magnetic fields arising from said input currents causing changes in direction of magnetization of that remaining one of said at least two ferromagnetic thin-film layers, and further including a third ferromagnetic thin-film layer spaced apart from that remaining one of said at least two ferromagnetic thin-film layers on a side thereof opposite that side across from which is positioned said ferromagnetic thin-film layer having a magnetization that is substantially maintained in a selected direction.

19. The apparatus of claim 1 wherein said first shield/concentrator layer is supported on said substrate between said first input conductor and said substrate.

20. The apparatus of claim 1 wherein said substrate further comprises a monolithic integrated circuit structure containing electronic circuit components of which at least one is electrically connected to said first input conductor.

21. A current determiner for providing at an output thereof representations of input currents provided therein from sources of such currents, said current determiner comprising: a substrate, a first input conductor supported on said substrate suited for conducting said input currents therethrough; a first shield/concentrator layer of material exhibiting a substantial magnetic permeability and positioned adjacent but spaced apart from that side of said first input conductor facing said substrate to serve as a magnetic field concentrator; and a first current sensor supported on said substrate on a side of said first input conductor opposite that said side thereof facing said substrate so as to be adjacent to, yet spaced apart from, said first input conductor at an opposite side thereof to thereby be electrically isolated from any direct circuit interconnection therewith on said substrate but positioned in those magnetic fields arising from said input currents, said first current sensor being formed of a plurality of magnetoresistive, anisotropic, ferromagnetic thin-film layers at least two of which are separated from one another by a nonmagnetic layer positioned therebetween, and also being free of any magnetic field biasing arrangement.

* * * * *

UNITED STATES PATENT AND TRADEMARK OFFICE
CERTIFICATE OF CORRECTION

PATENT NO. : 7,557,562 B2
APPLICATION NO. : 11/229282
DATED : July 7, 2009
INVENTOR(S) : John K. Myers et al.

It is certified that error appears in the above-identified patent and that said Letters Patent is hereby corrected as shown below:

Cover Page, Item (56), under U.S. Patent Documents
delete "4,097,802 A    6/1978 Mazzeo et al."
insert --4,097,802 A    6/1978 Mahapac--.

Signed and Sealed this
Twenty-third Day of August, 2011

David J. Kappos
*Director of the United States Patent and Trademark Office*